United States Patent
Obata et al.

(10) Patent No.: US 11,437,578 B2
(45) Date of Patent: *Sep. 6, 2022

(54) METHOD FOR PRODUCING FRAME-EQUIPPED VAPOR DEPOSITION MASK, STRETCHING APPARATUS, APPARATUS FOR PRODUCING ORGANIC SEMICONDUCTOR DEVICE AND METHOD FOR PRODUCING ORGANIC SEMICONDUCTOR DEVICE

(71) Applicant: DAI NIPPON PRINTING CO., LTD., Tokyo (JP)

(72) Inventors: Katsunari Obata, Tokyo (JP); Toshihiko Takeda, Tokyo (JP); Yoshiyuki Honma, Tokyo (JP); Hideyuki Okamoto, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 92 days.

This patent is subject to a terminal disclaimer.

(21) Appl. No.: 16/923,751

(22) Filed: Jul. 8, 2020

(65) Prior Publication Data

US 2020/0335699 A1 Oct. 22, 2020

Related U.S. Application Data

(60) Continuation of application No. 16/021,561, filed on Jun. 28, 2018, now Pat. No. 10,741,764, which is a
(Continued)

(30) Foreign Application Priority Data

Dec. 27, 2013 (JP) .................................. 2013-272965
Aug. 6, 2014 (JP) .................................. 2014-160136
Dec. 24, 2014 (JP) .................................. 2014-260435

(51) Int. Cl.
*H01L 51/00* (2006.01)
*C23C 14/24* (2006.01)
(Continued)

(52) U.S. Cl.
CPC ........ *H01L 51/0011* (2013.01); *C23C 14/042* (2013.01); *C23C 14/24* (2013.01);
(Continued)

(58) Field of Classification Search
CPC ..... C23C 14/042; C23C 16/04; C23C 16/042; H01L 51/0011
See application file for complete search history.

(56) References Cited

U.S. PATENT DOCUMENTS

| 5,534,969 A | 7/1996 | Miyake |
| 5,822,038 A | 10/1998 | Slater et al. |

(Continued)

FOREIGN PATENT DOCUMENTS

| CN | 101001972 A | 7/2007 |
| JP | 2007-169716 A1 | 7/2007 |

(Continued)

OTHER PUBLICATIONS

International Search Report and Written Opinion (Application No. PCT/JP2014/084246) dated Mar. 24, 2015.

*Primary Examiner* — Joseph A Miller, Jr.
(74) *Attorney, Agent, or Firm* — Burr & Brown, PLLC

(57) ABSTRACT

A method for producing a frame-equipped vapor deposition mask sequentially includes preparing a vapor deposition mask including a metal mask having a slit and a resin mask having an opening corresponding to a pattern to be produced by vapor deposition at a position overlapping the slit, the metal mask and the resin mask being stacked, retaining a part of the vapor deposition mask by a retainer and stretching the vapor deposition mask retained by the retainer
(Continued)

outward, and fixing the vapor deposition mask in a state of being stretched to a frame having a through hole. During stretching, any one or both adjustments of a rotating adjustment and a moving adjustment of the vapor deposition mask are performed with respect to the vapor deposition mask in the state of being stretched or with the vapor deposition mask being stretched.

6 Claims, 17 Drawing Sheets

Related U.S. Application Data division of application No. 15/188,111, filed on Jun. 21, 2016, now Pat. No. 10,043,974, which is a continuation of application No. PCT/JP2014/084246, filed on Dec. 25, 2014.

(51) Int. Cl.
| | | |
|---|---|---|
| C23C 14/04 | (2006.01) | |
| H01L 51/50 | (2006.01) | |
| H01L 27/32 | (2006.01) | |
| H01L 51/52 | (2006.01) | |
| H01L 51/56 | (2006.01) | |

(52) U.S. Cl.
CPC ...... *H01L 51/0021* (2013.01); *H01L 27/3211* (2013.01); *H01L 51/5012* (2013.01); *H01L 51/5221* (2013.01); *H01L 51/56* (2013.01)

(56) References Cited

U.S. PATENT DOCUMENTS

| | | | |
|---|---|---|---|
| 2003/0150384 A1* | 8/2003 | Baude | H01L 51/0011 118/721 |
| 2009/0260566 A1* | 10/2009 | Landgraf | G03F 7/12 118/504 |
| 2011/0185561 A1 | 8/2011 | Landgraf et al. | |
| 2014/0325822 A1 | 11/2014 | Bucci | |
| 2015/0037928 A1 | 2/2015 | Hirobe et al. | |
| 2015/0283651 A1* | 10/2015 | Kudo | B05C 21/005 264/400 |

FOREIGN PATENT DOCUMENTS

| | | |
|---|---|---|
| JP | 2007-257839 A1 | 10/2007 |
| JP | 2010-065281 A1 | 3/2010 |
| JP | 2013-163864 A1 | 8/2013 |
| JP | 5288072 B2 | 9/2013 |
| JP | 2013-245392 A1 | 12/2013 |

\* cited by examiner

VIEW SEEN FROM RESIN MASK SIDE

VIEW SEEN FROM RESIN MASK SIDE

VIEW SEEN FROM RESIN MASK SIDE

VIEW SEEN FROM RESIN MASK SIDE (a)

(b)

METHOD FOR PRODUCING FRAME-EQUIPPED VAPOR DEPOSITION MASK, STRETCHING APPARATUS, APPARATUS FOR PRODUCING ORGANIC SEMICONDUCTOR DEVICE AND METHOD FOR PRODUCING ORGANIC SEMICONDUCTOR DEVICE

CROSS REFERENCE TO RELATED APPLICATIONS

This application is a continuation of U.S. application Ser. No. 16/021,561, filed Jun. 28, 2018, which is a division of U.S. application Ser. No. 15/188,111, filed Jun. 21, 2016, now U.S. Pat. No. 10,043,974, issued Aug. 7, 2018, which is a continuation of International Application No. PCT/JP2014/084246, filed Dec. 25, 2014, which designated the United States, the entireties of which are incorporated herein by reference.

FIELD OF THE INVENTION

Embodiments of the present invention relate to a method for producing a frame-equipped vapor deposition mask, a stretching apparatus, an apparatus for producing an organic semiconductor device and a method for producing an organic semiconductor device.

BACKGROUND OF THE INVENTION

With upsizing of the products using organic EL elements or increase in substrate sizes, a demand for upsizing is also growing with respect to vapor deposition masks, and the metal plates for use in production of the vapor deposition masks composed of metals are also upsized. However, with the present metal processing technique, it is difficult to form openings in a large metal plate with high precision, which cannot respond to enhancement in definition of the openings. Moreover, in the case of a vapor deposition mask composed of only a metal, the weight thereof also increases with upsizing, and the total mass including a frame also increases, which becomes a hindrance to handling.

Under such circumstances, in Patent Document 1, there is proposed a vapor deposition mask including a metal mask in which slits are provided and a resin mask which is positioned on the surface of the metal mask and in which openings corresponding to a pattern to be produced by vapor deposition are arranged for a plurality of rows in the lengthwise direction and the crosswise direction, the metal mask and the resin mask being stacked. The vapor deposition mask proposed in Patent Document 1 is regarded as being capable of satisfying both high definition and lightweight in upsizing, and moreover, forming a vapor deposition pattern with high definition.

When the vapor deposition pattern is formed on a vapor deposition processing target using the vapor deposition mask, a frame-equipped vapor deposition mask having the vapor deposition mask fixed to a frame composed of metal material, ceramic material or the like is typically used. Fixing the vapor deposition mask to the frame is important to be performed in the state where the vapor deposition mask is correctly positioned. A part of the vapor deposition mask, for example, opposite two sides (both ends) of the vapor deposition mask are retained by retainers such, for example, as clamps, and fixing to the frame is performed in the state where the vapor deposition mask is being stretched by operating driving devices such as motors and air cylinders joined to the clamps or the like which are the retainers.

CITATION LIST

Patent Document

Patent Document 1: Japanese Patent No. 5288072

SUMMARY OF THE INVENTION

Technical Problem

In the case where the vapor deposition mask is not correctly retained by the retainer such as the clamps, for example, in the case where both ends of the vapor deposition mask are asymmetrically retained although both ends of the vapor deposition mask is parallelly retained, or in the case where both ends of the vapor deposition mask are not parallelly retained, namely, in the case where the vapor deposition mask is retained in the state of being obliquely inclined when in order to fix the vapor deposition mask to the frame, a part of the vapor deposition mask, for example, opposite two sides (both ends) of the vapor deposition mask are retained by the retainers such as the clamps and the retainers are pulled outward of the vapor deposition mask, as shown in FIG. 8($a$) and FIG. 9($a$), "twist" arises in the vapor deposition mask when the vapor deposition mask is stretched. Since the aforementioned vapor deposition mask that is proposed in Patent Document 1 has a resin mask in which openings corresponding to a pattern to be produced by vapor deposition are formed, variation in dimension of the openings tends to arise due to the "twist". Accordingly, even in the case where the openings are formed in the resin mask with extremely high dimensional precision, unless the problem of "twist" in fixing to the frame in the state where the vapor deposition mask including the resin mask is stretched is improved, formation of the vapor deposition pattern with high definition is difficult eventually.

An embodiment of the present invention is devised under such circumstances and primary objects thereof are to provide a method for producing a frame-equipped vapor deposition mask in which a vapor deposition mask is fixed to a frame in the state where "twist" is suppressed, to provide a stretching apparatus used for producing the aforementioned frame-equipped vapor deposition mask, and to provide an apparatus for producing an organic semiconductor device and a method for producing an organic semiconductor device capable of producing an organic semiconductor device in high precision.

Solution to Problem

According to an embodiment of the present invention to solve the aforementioned problem, there is provided a method for producing a frame-equipped vapor deposition mask, including: a preparing step of preparing a vapor deposition mask including a metal mask having a slit and a resin mask having an opening corresponding to a pattern to be produced by vapor deposition at a position overlapping with the slit, the metal mask and the resin mask being stacked; a stretching step of retaining a part of the vapor deposition mask prepared in the preparing step by a retainer and stretching the vapor deposition mask retained by the retainer outward thereof; and a fixing step of fixing, after the stretching step, the vapor deposition mask in a state of being stretched to a frame having a through hole, wherein in the stretching step, any one or both adjustments of a rotating adjustment and a moving adjustment of the vapor deposition mask are performed with respect to the vapor deposition mask in the state of being stretched or with the vapor deposition mask being stretched.

Moreover, the aforementioned method for producing a frame-equipped vapor deposition mask may further include a locking step of locking the vapor deposition mask having undergone any one or both adjustments of the rotating adjustment and the moving adjustment in the stretching step so as to maintain a state after the adjustment, wherein in the fixing step, the locked vapor deposition mask may be fixed to the frame having the through hole.

Moreover, the aforementioned method for producing a frame-equipped vapor deposition mask may further include: a first placing step of placing the vapor deposition mask on the frame; a separating step of separating the vapor deposition mask from the frame after the first placing step; and a second placing step of placing the vapor deposition mask again on the frame after the separating step, wherein the stretching step may be performed before the first placing step or between the first placing step and the separating step, and the fixing step may be performed after the second placing step.

Moreover, the aforementioned method for producing a frame-equipped vapor deposition mask may further include, after the stretching step, a precise adjusting step of performing a precise adjustment of the vapor deposition mask by stacking an auxiliary member on one surface of the vapor deposition mask in the state of being stretched, fixing the auxiliary member to the vapor deposition mask in at least part of a portion in which the one surface of the vapor deposition mask and the auxiliary member overlap with each other, and pulling the auxiliary member, wherein the fixing step may be performed after the precise adjusting step.

Moreover, in the aforementioned method for producing a frame-equipped vapor deposition mask, the retainer which retains the part of the vapor deposition mask in the stretching step may be a retainer including at least one mechanism of a first rotating mechanism rotatable with a first rotational axis intersecting a surface of the vapor deposition mask being as an axis, a second rotating mechanism rotatable with a second rotational axis not intersecting the surface of the vapor deposition mask being as an axis, and a linearly movable moving mechanism, and in the stretching step, any of the rotating adjustment and the moving adjustment of the vapor deposition mask may be performed by any mechanism of the first rotating mechanism, the second rotating mechanism and the moving mechanism in the retainer.

Moreover, in the aforementioned method for producing a frame-equipped vapor deposition mask, the vapor deposition mask prepared in the preparing step may be a vapor deposition mask including a metal mask having a plurality of slits, and a resin mask having openings needed for constituting a plurality of screens, the metal mask and the resin mask being stacked, and each of the slits may be provided at a position overlapping with an entirety of at least one screen. Moreover, in the aforementioned method for producing a frame-equipped vapor deposition mask, the vapor deposition mask prepared in the preparing step may be a vapor deposition mask including a metal mask having one slit, and a resin mask having a plurality of openings, the metal mask and the resin mask being stacked, and all of the plurality of openings may be provided at a position overlapping with the one slit.

Moreover, according to an embodiment of the present invention to solve the aforementioned problem, there is provided a stretching apparatus for stretching a vapor deposition mask, including: a retainer that retains a part of the vapor deposition mask; and a stretching mechanism for stretching the vapor deposition mask retained by the retainer, wherein the retainer includes at least one mechanism of a first rotating mechanism rotatable with a first rotational axis intersecting a surface of the vapor deposition mask being as an axis, a second rotating mechanism rotatable with a second rotational axis not intersecting the surface of the vapor deposition mask being as an axis, and a linearly movable moving mechanism.

Moreover, the aforementioned stretching apparatus may include a drive stage for driving a frame, wherein the drive stage may include a moving mechanism movable in a direction intersecting an installation plane of the stretching apparatus.

Moreover, the retainer in the aforementioned stretching apparatus may include a moving mechanism movable in a direction intersecting an installation plane of the stretching apparatus.

Moreover, according to an embodiment of the present invention to solve the aforementioned problem, there is provided an apparatus for producing an organic semiconductor device, wherein the aforementioned stretching apparatus is implemented.

Moreover, according to an embodiment of the present invention to solve the aforementioned problem, there is provided a method for producing an organic semiconductor device, including a step of forming a vapor deposition pattern on a vapor deposition target using a frame-equipped vapor deposition mask in which a vapor deposition mask is fixed to a frame, wherein the frame-equipped vapor deposition mask used in the step of forming the vapor deposition pattern is a frame-equipped vapor deposition mask obtained by a stretching step of retaining a part of the vapor deposition mask by a retainer, stretching the vapor deposition mask retained by the retainer outward thereof, and performing any one or both adjustments of a rotating adjustment and a moving adjustment of the vapor deposition mask with respect to the vapor deposition mask in a state of being stretched or with the vapor deposition mask being stretched, and a fixing step of fixing, after the stretching step, the vapor deposition mask in the state of being stretched to the frame having a through hole.

Advantageous Effects

According to the method for producing a frame-equipped vapor deposition mask and the stretching apparatus of an embodiment of the present invention, a frame-equipped vapor deposition mask in which a vapor deposition mask is fixed to a frame can be produced in the state where "twist" is suppressed. Moreover, according to the apparatus for producing an organic semiconductor device and the method for producing an organic semiconductor device of an embodiment of the present invention, an organic semiconductor device can be produced with excellent precision.

DETAILED DESCRIPTION OF THE INVENTION

Figure 1:
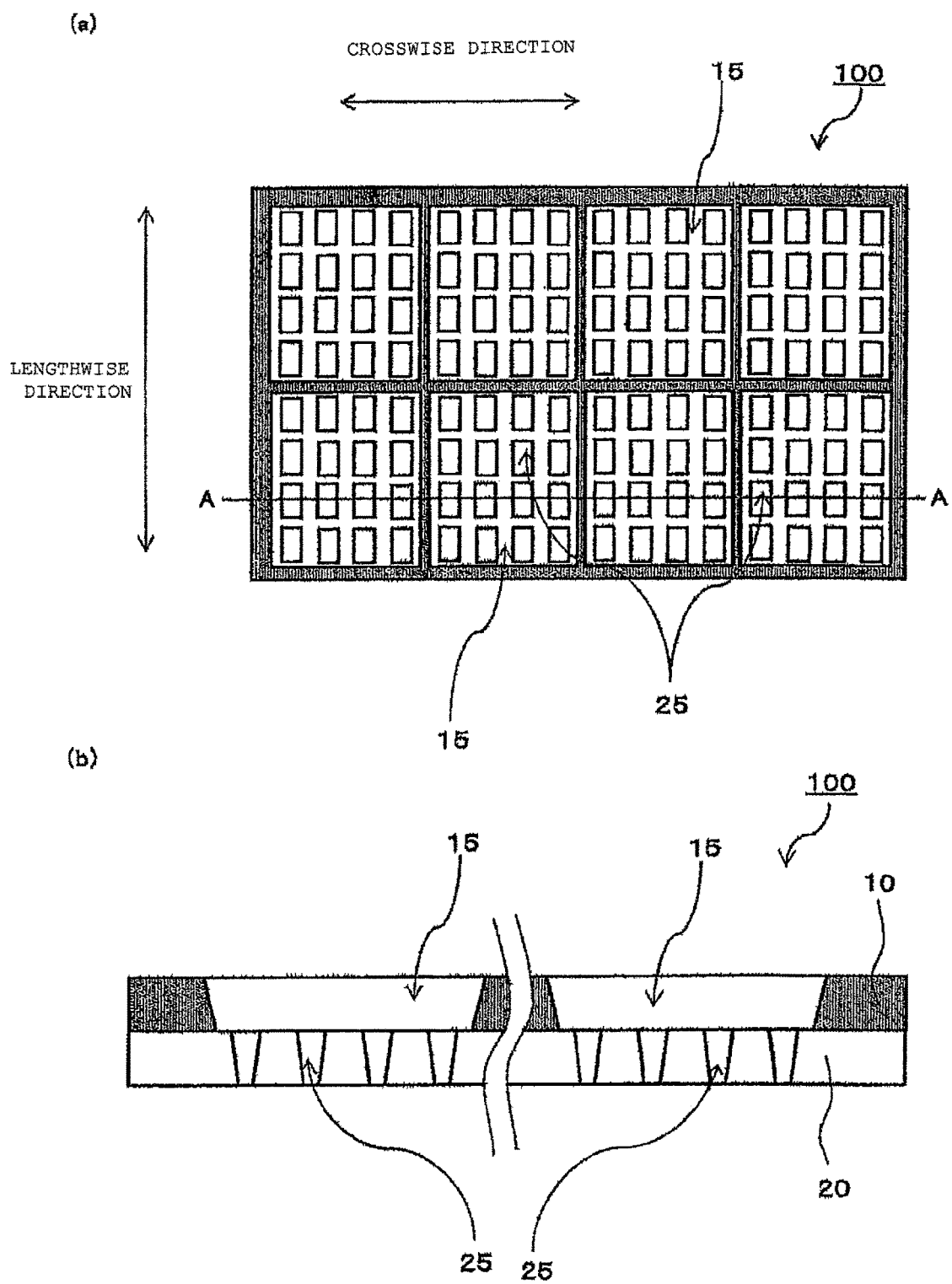
FIG. 1 is a diagram exemplarily showing a vapor deposition mask prepared in a preparing step, portion (a) is a top view thereof as seen from a metal mask side and portion (b) is a cross-sectional view taken along the line A-A in portion (a).

Hereafter, a method for producing a frame-equipped vapor deposition mask of an embodiment of the present invention is specifically described using the drawings.

Method for Producing Frame-Equipped Vapor Deposition Mask

A method for producing a frame-equipped vapor deposition mask of an embodiment includes: a preparing step of preparing a vapor deposition mask 100 including a metal mask 10 in which a slit 15 is formed and a resin mask 20 in which an opening 25 corresponding to a pattern to be produced by vapor deposition is formed at a position overlapping with the slit, the metal mask and the resin mask being stacked; a stretching step of retaining a part of the vapor deposition mask 100 prepared in the preparing step by a retainer 80 and stretching the vapor deposition mask retained by the retainer 80 outward thereof; and a fixing step of fixing, after the stretching step, the vapor deposition mask in a state of being stretched to a frame 60 in which a through hole is formed, wherein in the stretching step, any one or both adjustments of a rotating adjustment and a moving adjustment of the vapor deposition mask are performed with respect to the vapor deposition mask in the state of being stretched or with the vapor deposition mask being stretched.

The method for producing a frame-equipped vapor deposition mask by way of example includes: a preparing step of preparing a vapor deposition mask 100 including a metal mask 10 in which a slit 15 is formed and a resin mask 20 in which an opening 25 corresponding to a pattern to be produced by vapor deposition is formed at a position overlapping with the slit, the metal mask and the resin mask being stacked; a stretching step of retaining opposite two sides of the vapor deposition mask prepared in the preparing step by retainers 80 and stretching the vapor deposition mask outward thereof by pulling at least one of the retainers 80 outward of the vapor deposition mask; and a fixing step of fixing the vapor deposition mask in a state of being stretched in the stretching step to a frame in which a through hole is formed, wherein in the stretching step, at least one of the retainers 80 retaining the vapor deposition mask is a retainer 80 including at least one mechanism of a first rotating mechanism rotatable with a first rotational axis intersecting a surface of the vapor deposition mask, for example, a first rotational axis perpendicular to the surface of the vapor deposition mask being as an axis, a second rotating mechanism rotatable with a second rotational axis not intersecting the surface of the vapor deposition mask, for example, a second rotational axis parallel to the surface of the vapor deposition mask being as an axis, and a moving mechanism linearly movable, for example, linearly movable in a direction perpendicular to a direction in which the vapor deposition mask is stretched, and in the stretching step, any one or both adjustments of a rotating adjustment and a moving adjustment of the vapor deposition mask are performed by the retainers 80 with respect to the vapor deposition mask in the state of being stretched or with the vapor deposition mask being stretched.

Hereafter, the steps are described.

Preparing Step

As shown in FIGS. 1(a) and 1(b), the preparing step is a step of preparing the vapor deposition mask 100 including the metal mask 10 in which the slits 15 are formed and the resin mask 20 in which the openings 25 corresponding to a pattern to be produced by vapor deposition are formed at a position overlapping with the slits, the metal mask and the resin mask being stacked.

Resin Mask

As shown in FIG. 1, a plurality of openings 25 are provided in the resin mask 20. FIG. 1(a) is a top view of a vapor deposition mask used in the method for producing a frame-equipped vapor deposition mask of an embodiment as seen from the metal mask side and FIG. 1(b) is a schematic cross-sectional view taken along the line A-A in FIG. 1(a).

While in the mode shown in the figure, the opening shape of the opening 25 exhibits a rectangular shape, the opening shape is not specially limited but it may be any shape as long as it is a shape corresponding to a pattern to be produced by vapor deposition. For example, the opening shape of the opening 25 may be rhombic or polygonal or may be a shape having a curvature such as a circle and an ellipsoid. Notably, it can be said that the rectangular or polygonal opening shape is a preferable opening shape of the opening 25 in view of capability of securing a larger area of light emission as compared with the opening shape having a curvature such as a circle and an ellipsoid.

The material of the resin mask 20 is not limited but, for example, a material that enables formation of the opening 25 with high definition by laser processing or the like, has a low rate of dimensional change and a low rate of humidity absorption under heat and with passage of time, and is light weight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinylalcohol copolymer resin, an ethylene-methacrylic acid copolymer resin, a polyvinyl chloride resin, a polyvinylidene chloride resin, cellophane, an ionomer resin and the like can be cited. Among the materials shown above by way of example, the resin materials with the thermal expansion coefficients of about 16 ppm/° C. or less are preferable, the resin materials with the rates of humidity absorption of about 1.0% or less are preferable, and the resin materials including both conditions are particularly preferable. The resin mask using these resin materials enables dimensional precision of the openings 25 to be improved and a rate of dimensional change and a rate of humidity absorption under heat and with passage of time to be small.

The thickness of the resin mask 20 is not specially limited but, in the case of further improving the effect of suppressing generation of a shadow, the thickness of the resin mask 20 is preferably about 25 μm or less, still preferably less than about 10 μm. A preferable range of the lower limit value is not specially limited but, in the case where the thickness of the resin mask 20 is less than about 3 μm, defects such as a pinhole tend to arise and a risk of deformation or the like increases. In particular, by setting the thickness of the resin mask 20 to be about 3 μm or more and less than about 10 μm, still preferably about 4 μm or more and about 8 μm or less, the influence of a shadow in formation of a high definition pattern exceeding 400 ppi can be more effectively prevented. Moreover, while the resin mask 20 may be directly bonded to the metal mask 10 mentioned later or may be bonded thereto via an adhesive layer, in the case where the resin mask 20 is bonded to the metal mask 10 via the adhesive layer, the total thickness of the resin mask 20 and the adhesive layer is preferably within the aforementioned preferable thickness range. Notably, the shadow is a phenomenon that a part of a vapor deposition material released from a vapor deposition source collides with inner wall surfaces of the slit of the metal mask and/or the opening of the resin mask and does not reach the vapor deposition target, and thereby, a portion without vapor deposition that has a film thickness smaller than the intended vapor deposition film thickness arises.

The sectional shape of the opening 25 is not specially limited and end surfaces that face each other and are of the resin mask forming the opening 25 may be substantially parallel to each other, but as shown in FIG. 1(b), the sectional shape of the opening 25 is preferably the shape having broadening toward a vapor deposition source. In other words, it preferably has a taper surface having broadening toward the metal mask 10 side. While a taper angle can be properly set with the thickness or the like of the resin mask 20 taken into consideration, an angle formed by a straight line connecting a lower bottom distal end in the opening of the resin mask and an upper bottom distal end of the opening of the same resin mask and the bottom surface of the resin mask, in other words, an angle formed by an inner wall surface of the opening 25 and a surface of the resin mask 20 on the side that is not in contact with the metal mask 10 (a lower surface of the resin mask in the mode shown in the figure) in the cross section in the thickness direction of the inner wall surface composing the opening 25 of the resin mask 20 is preferably within a range of about 5° to about 85°, still preferably within a range of about 15° to about 75°, further preferably within a range of about 25° to about 65°. In particular, within this range, it is preferably an angle smaller than a vapor deposition angle of a vapor deposition machine to be used. Moreover, in the mode shown in the figure, while an end surface that forms the opening 25 exhibits a linear shape, it is not limited thereto but may be in a curved shape convex outward, in other words, a shape of the entirety of the opening 25 may be a bowl shape.

Metal Mask

As shown in FIG. 1(b), the metal mask 10 is stacked on one side of the resin mask 20. The metal mask 10 is composed of metal, in which the slits 15 extending in the lengthwise direction or the crosswise direction are arranged. The slit 15 is synonymous with an opening. An arrangement example of the slits is not specially limited. The slits extending in the lengthwise direction and the crosswise direction may be arranged in a plurality of rows in the lengthwise direction and the crosswise direction. The slits extending in the lengthwise direction may be arranged in a plurality of rows in the crosswise direction. The slits extending in the crosswise direction may be arranged in a plurality of rows in the lengthwise direction. Moreover, they may be arranged in only one row in the lengthwise direction or the crosswise direction. Notably, "lengthwise direction" and "crosswise direction" stated in the present specification indicate the vertical direction and the horizontal direction in the drawings, respectively, and may be any directions of the longitudinal direction and the width direction of the vapor deposition mask, the resin mask and the metal mask. For example, the longitudinal direction of the vapor deposition mask, the resin mask and the metal mask may be set to be the "lengthwise direction", or the width direction thereof may be set to be the "lengthwise direction". Moreover, while in the present specification, the case where the shape of the vapor deposition mask in plan view is a rectangular shape is exemplarily described, it may be another shape such, for example, as a circular shape and a polygonal shape such as a rhombic shape. In this case, the longitudinal direction of the diagonal line, the radial direction, or any direction only has to be set as the "longitudinal direction", the direction perpendicular to the "longitudinal direction" set as the "width direction (sometimes referred to as short-side direction)".

The material of the metal mask 10 is not specially limited but a conventionally known one in the field of the vapor deposition mask can be properly selected and used, and, for example, a metal material such as stainless steel, an iron-nickel alloy and an aluminum alloy can be cited. Above all, an invar material which is an iron-nickel alloy can be preferably used since an invar material is hardly deformed by heat.

While the thickness of the metal mask 10 is not specially limited, in order to more effectively prevent generation of a shadow, it is preferably about 100 μm or less, still preferably about 50 μm or less, particularly preferably about 35 μm or less. Notably, in the case of being thinner than about 5 μm, risks of rupture and deformation tend to increase and handling tends to become difficult.

Moreover, while in the mode shown in FIG. 1(a), the shape of the opening of the slit 15 in plan view exhibits a rectangular shape, the opening shape is not specially limited but the opening shape of the slit 15 may be any shape such as a trapezoid and a circle.

The sectional shape of the slit 15 formed in the metal mask 10 is not specially limited but is preferably a shape having broadening toward the vapor deposition source as shown in FIG. 1(b). More specifically, an angle formed by a straight line connecting the lower bottom distal end in the slit 15 of the metal mask 10 and the upper bottom distal end in the same slit 15 of the metal mask 10 and the bottom surface of the metal mask 10, in other words, an angle formed by the inner wall surface of the slit 15 and the surface of the metal mask 10 on the side of being in contact with the resin mask 20 (the lower surface of the metal mask in the shown mode) in the thicknesswise cross section of the inner wall surface composing the slit 15 of the metal mask 10 is preferably within a range of about 5° to about 85°, still preferably within a range of about 15° to about 80°, further preferably within a range of about 25° to about 65°. In particular, within this range, it is preferably an angle smaller than a vapor deposition angle of a vapor deposition machine to be used.

A method of stacking the metal mask 10 on the resin mask is not specially limited but the metal mask 10 may be pasted on the resin mask 20 using various adhesives or the resin mask that has self-adhesion may be used. The dimensions of the resin mask 20 and the metal mask 10 may be the same or may be different dimensions. Notably, with fixing to a frame which is arbitrarily performed afterward taken into consideration, the dimension of the resin mask 20 is preferably made smaller than that of the metal mask 10 to set the outer circumferential portion of the metal mask 10 to be in the state of exposure, which facilitates fixing of the metal mask 10 to the frame.

Hereafter, preferable modes of the vapor deposition mask prepared in the present step are described, exemplified by Embodiment (A) and Embodiment (B). Notably, the vapor deposition mask 100 prepared in the present step is not limited to Embodiment (A) and Embodiment (B) described below but may be in any mode as long as a condition that the metal mask 10 in which the slit 15 is formed and the resin mask 20 in which the opening 25 corresponding to a pattern to be produced by vapor deposition is formed at a position overlapping with the slit 15 are stacked is satisfied. For example, the slit 15 formed in the metal mask 10 may be a stripe shape (not shown). Moreover, the slit 15 of the metal mask 10 may be provided at a position of not overlapping with the entirety of one screen.

Vapor Deposition Mask of Embodiment (A)

Figure 2:
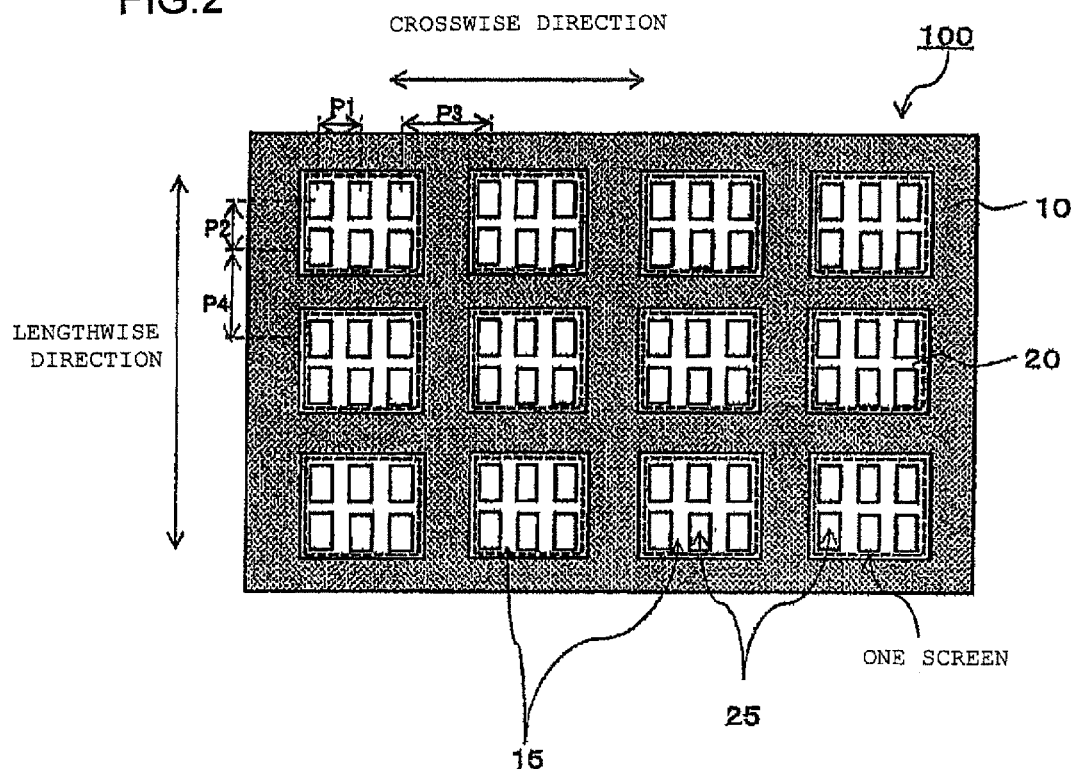
FIG. 2 is a top view of the vapor deposition mask of Embodiment (A) prepared in the preparing step as seen from the metal mask side.
Figure 3:
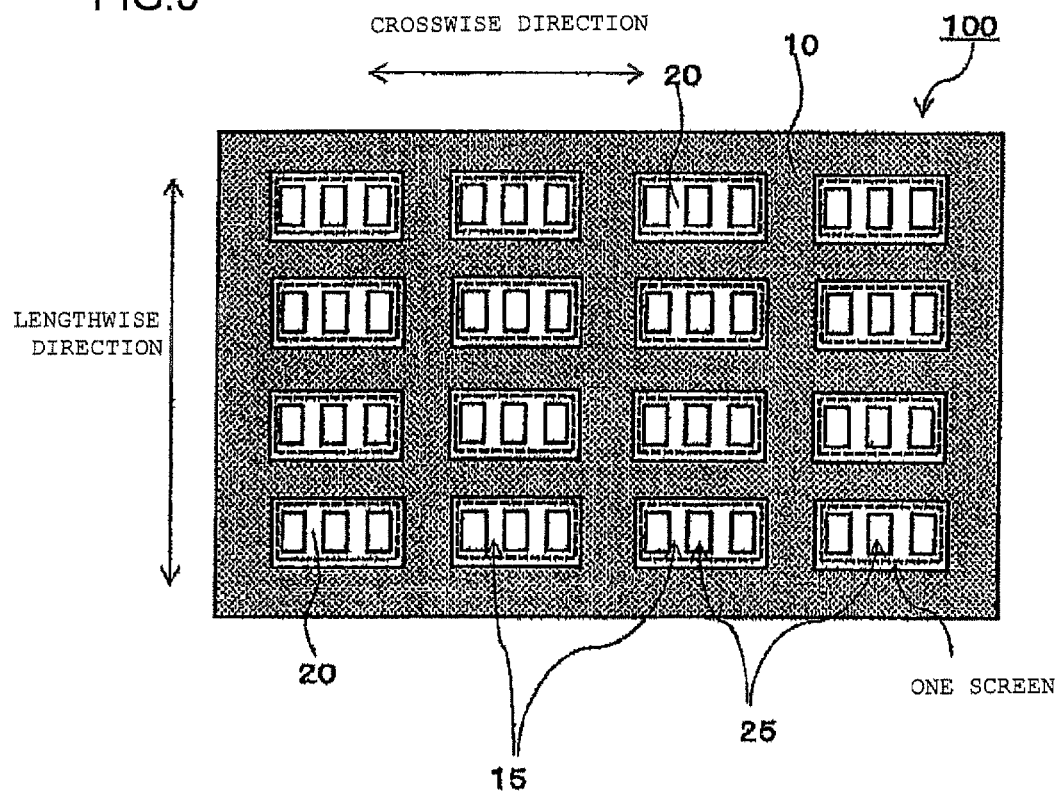
FIG. 3 is a top view of the vapor deposition mask of Embodiment (A) prepared in the preparing step as seen from the metal mask side.
Figure 4:
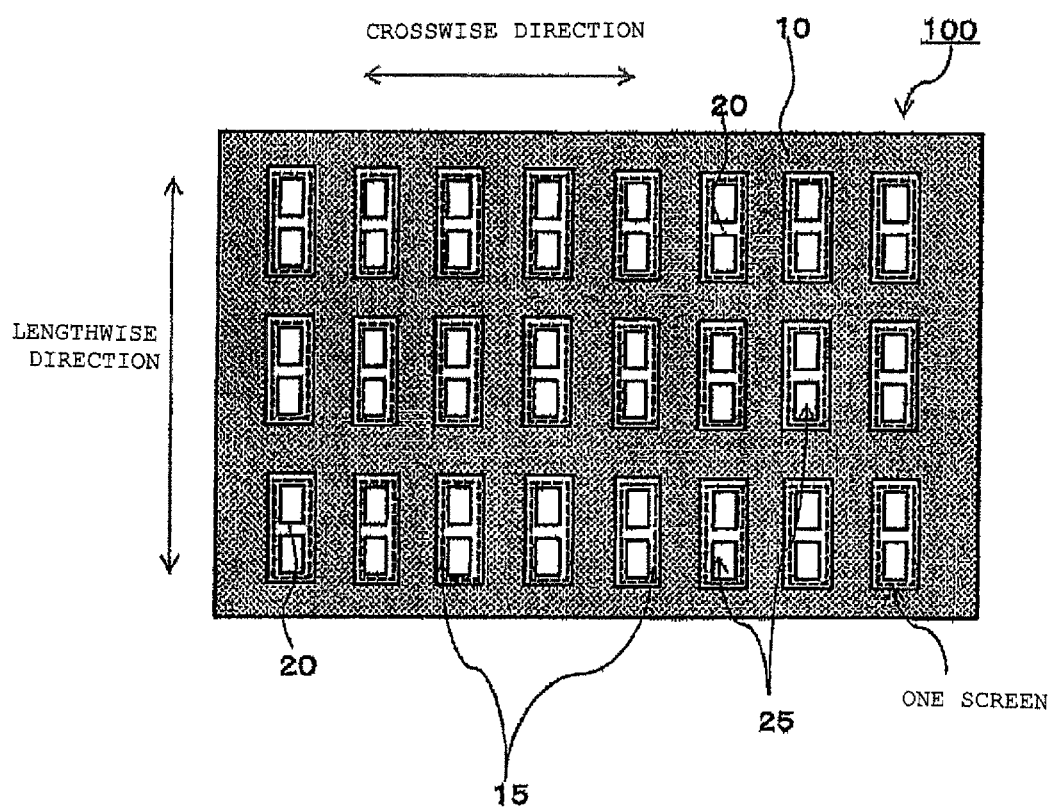
FIG. 4 is a top view of the vapor deposition mask of Embodiment (A) prepared in the preparing step as seen from the metal mask side.

As shown in FIG. 2, the vapor deposition mask 100 of Embodiment (A) is a vapor deposition mask for simultaneously forming vapor deposition patterns for a plurality of screens and includes the metal mask 10 in which the plurality of slits 15 are provided and the resin mask 20, the metal mask being stacked on one surface of the resin mask, wherein the openings 25 needed for composing the plurality of screens are provided in the resin mask 20, and each slit 15 is provided at a position overlapping with the entirety of at least one screen.

The vapor deposition mask 100 of Embodiment (A) is a vapor deposition mask used for simultaneously forming vapor deposition patterns for a plurality of screens. One vapor deposition mask 100 can simultaneously form vapor deposition patterns compatible with a plurality of products. "Openings" stated for the vapor deposition mask of Embodiment (A) mean patterns to be produced using the vapor deposition masks 100 of Embodiment (A). For example, when the vapor deposition mask is used for forming an organic layer in an organic EL display, the shape of the openings 25 is a shape of the organic layer. Moreover, "one screen" is constituted of an aggregate of openings 25 corresponding to one product. When the one product is an organic EL display, an aggregate of organic layers needed for forming one organic EL display, in other words, an aggregate of openings 25 to be the organic layers is "one screen". Further, in the vapor deposition mask 100 of Embodiment (A), in order to simultaneously form the vapor deposition patterns for the plurality of screens, the aforementioned "one screen" is arranged for each of the plurality of screens in the resin mask 20 at predetermined intervals. Namely, in the resin mask 20, the openings 25 needed for composing the plurality of screens are provided.

The vapor deposition mask of Embodiment (A) includes the metal mask 10 in which the plurality of slits 15 are provided, the metal mask being stacked on one surface of the resin mask, wherein each slit is provided at the position overlapping with the entirety of at least one screen. In other words, it is characterized in that between the openings 25 needed for composing one screen, metal line portions which have the same length as the length of the slit 15 in the lengthwise direction and have the same thickness as that of the metal mask 10 between the openings 25 adjacent in the crosswise direction, or metal line portions which have the same length as the length of the slit 15 in the crosswise direction and have the same thickness as that of the metal mask 10 between the openings 25 adjacent in the lengthwise direction do not exist. Hereafter, the metal line portions which have the same length as the length of the slit 15 in the lengthwise direction and have the same thickness as that of the metal mask 10 and the metal line portions which have the same length as the length of the slit 15 in the crosswise direction and have the same thickness as that of the metal mask 10 are sometimes collectively referred to simply as metal line portions.

According to the vapor deposition mask 100 of Embodiment (A), even when the dimension of the openings 25 needed for composing one screen and the pitch between the openings 25 composing one screen are made small, for example, even when the dimension of the openings 25 and the pitch between the openings 25 are made extremely fine in order to form a screen exceeding 400 ppi, interference due to metal line portions can be prevented and an image with high definition can be formed. Notably, when one screen is divided by a plurality of slits, in other words, when the metal line portions having the same thickness as that of the metal mask 10 exist between the openings 25 composing one screen, as the pitch between the openings 25 composing one screen is smaller, the metal line portions existing between the openings 25 more become a hindrance in forming the vapor deposition pattern on the vapor deposition target and the vapor deposition pattern with high definition is more difficult to be formed. In other words, when the metal line portions having the same thickness as that of the metal mask 10 exist between the openings 25 composing one screen, the metal line portions in the case of being the frame-equipped vapor deposition mask cause generation of a shadow, which results in difficulty of formation of a screen with high definition.

Next, referring to FIG. 2 to FIG. 6, the openings 25 composing one screen are exemplarily described. Notably, a region enclosed by a broken line in the modes shown in the figures is one screen. While in the modes shown in the figures, an aggregate of a small number of openings 25 is one screen for convenience of description, not limited to these modes, for example, the openings 25 for millions of pixels may be present in one screen, where one opening 25 is one pixel.

In the mode shown in FIG. 2, one screen is composed of an aggregate of openings 25 having a plurality of openings 25 provided in the lengthwise direction and the crosswise direction. In the mode shown in FIG. 3, one screen is composed of an aggregate of openings 25 having a plurality of openings 25 provided in the crosswise direction. Moreover, in the mode shown in FIG. 4, one screen is composed of an aggregate of openings 25 having a plurality of openings 25 in the lengthwise direction. Further, in FIG. 2 to FIG. 4, the slit 15 is provided at a position overlapping with the entirety of one screen.

Figure 5:
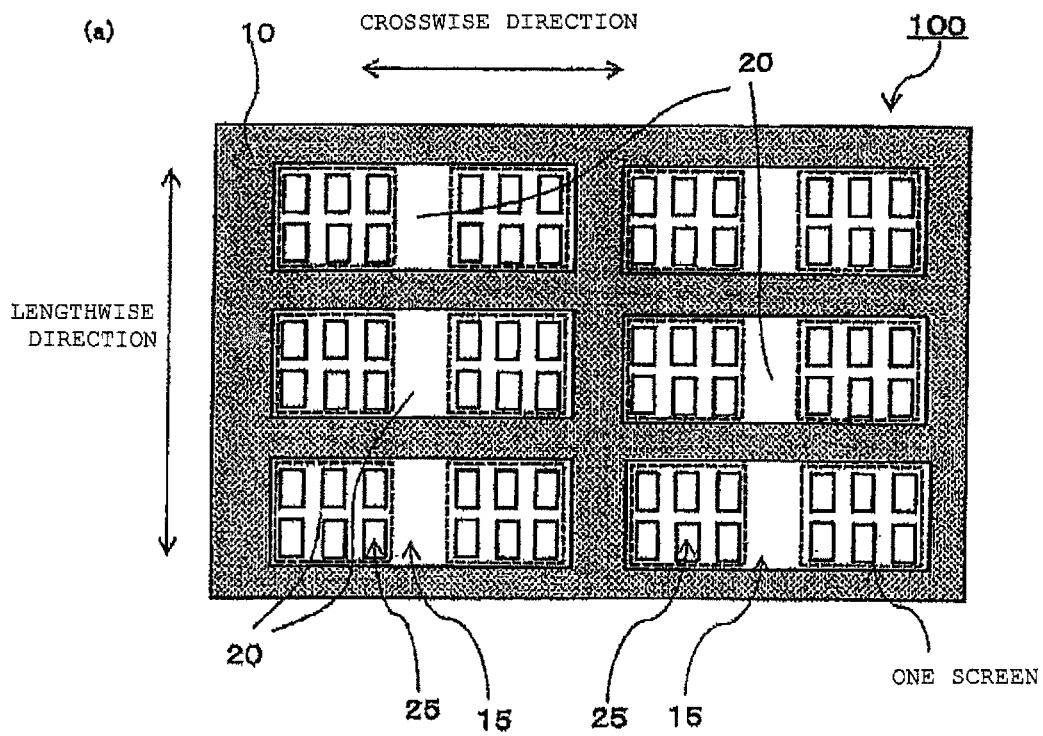
FIG. 5 presents top views of the vapor deposition mask of Embodiment (A) prepared in the preparing step as seen from the metal mask side.
Figure 5:
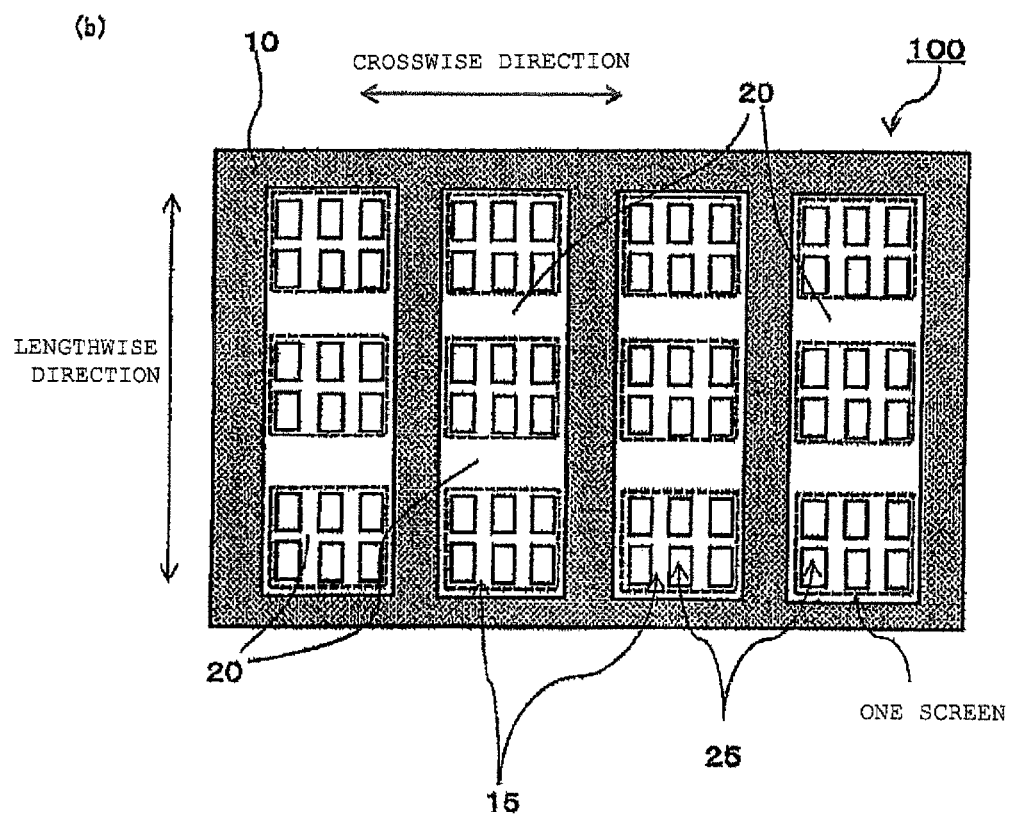

As described above, the slit 15 may be provided at a position overlapping with only one screen, or as shown in FIGS. 5(*a*) and 5(*b*), may be provided at a position overlapping with the entirety of two or more screens. In FIG. 5(*a*), in the resin mask 10 shown in FIG. 2, the slit 15 is provided at a position overlapping with the entirety of two screens continuous in the crosswise direction. In FIG. 5(*b*), the slit 15 is provided at a position overlapping with the entirety of three screens continuous in the lengthwise direction.

Next, exemplified by the mode shown in FIG. 2, pitches between the openings 25 composing one screen and pitches between the screens are described. The pitches between the openings 25 composing one screen and the dimension of the opening 25 are not specially limited but can be properly set depending on the pattern to be produced by vapor deposition. For example, when forming the vapor deposition pattern with high definition of 400 ppi, a pitch (P1) in the crosswise direction and a pitch (P2) in the lengthwise direction between the neighboring openings 25 out of the openings 25 composing one screen are about 60 μm. Moreover, the dimension of the opening is about 500 μm$^2$ to about 1000 μm$^2$. Moreover, one opening 25 is not limited to correspond to one pixel but, for example, a plurality of pixels can also be collectively one opening 25 depending on a pixel arrangement.

While a pitch (P3) in the crosswise direction and a pitch (P4) in the lengthwise direction between the screens are not specially limited but, as shown in FIG. 2, when one slit 15 is provided at the position overlapping with the entirety of one screen, metal line portions are to exist between the screens. Accordingly, when the pitch (P3) in the crosswise direction and the pitch (P4) in the lengthwise direction between the screens are smaller than or substantially equal to the pitch (P1) in the crosswise direction and the pitch (P2) in the lengthwise direction of the openings 25 provided in one screen, the metal line portions existing between the screens are liable to break. Accordingly, with this point taken into consideration, the pitch (P3, P4) between the screens is preferably wider than the pitch (P1, P2) between the openings 25 composing one screen. The pitch (P3, P4) between the screens is exemplarily about 1 mm to about 100 mm. Notably, the pitch between the screens means the pitch between the neighboring openings in one screen and another screen adjacent to the one screen. The same holds true for the pitch between the openings 25 and the pitch between the screens in the vapor deposition mask of Embodiment (B) mentioned later.

Notably, as shown in FIG. 5, when one slit 15 is provided at the position overlapping with the entirety of two or more screens, metal line portions composing the inner wall surfaces of the slit are not to exist between the plurality of screens provided in the one slit 15. Accordingly, in this case, the pitch between the two or more screens provided at the position overlapping with the one slit 15 may be substantially equal to the pitch between the openings 25 composing one screen.

Moreover, on the resin mask 20, grooves (not shown) are preferably formed to extend in the lengthwise direction or the crosswise direction of the resin mask 20.

While in the case of application of heat in vapor deposition, there is a possibility that the resin mask 20 undergoes thermal expansion, and thereby, changes in dimension and position of the opening 25 arise, by forming the grooves, they can absorb the expansion of the resin mask, and can prevent the changes in dimension and position of the opening 25 caused by the resin mask 20 expanding in a predetermined direction as a whole due to accumulation of thermal expansions arising in portions in the resin mask. Formation positions of the grooves are not limited but while they may be provided between the openings 25 composing one screen and at positions overlapping with the openings 25, they are preferably provided between the screens. Moreover, the grooves may be provided on one surface of the resin mask, for example, only on the surface on the side that is in contact with the metal mask, or may be provided only on the surface on the side that is not in contact with the metal mask. Otherwise, they may be provided on both surfaces of the resin mask 20.

Moreover, the grooves extending in the lengthwise direction may be between the neighboring screens, or the grooves extending in the crosswise direction may be formed between the neighboring screens. Furthermore, the grooves can also be formed in an aspect having these combined.

The depth and the width of the grooves are not specially limited but since the rigidity of the resin mask 20 tends to decrease in the case where the depth of the grooves is too large and in the case where the width thereof is too large, setting is needed with this point taken into consideration. Moreover, the sectional shape of the grooves is not specially limited but only has to be arbitrarily selected as a U-shape, a V-shape or the like with the processing method and the like taken into consideration. The same holds true for the vapor deposition mask of Embodiment (B).

Vapor Deposition Mask of Embodiment (B)

Figure 6:
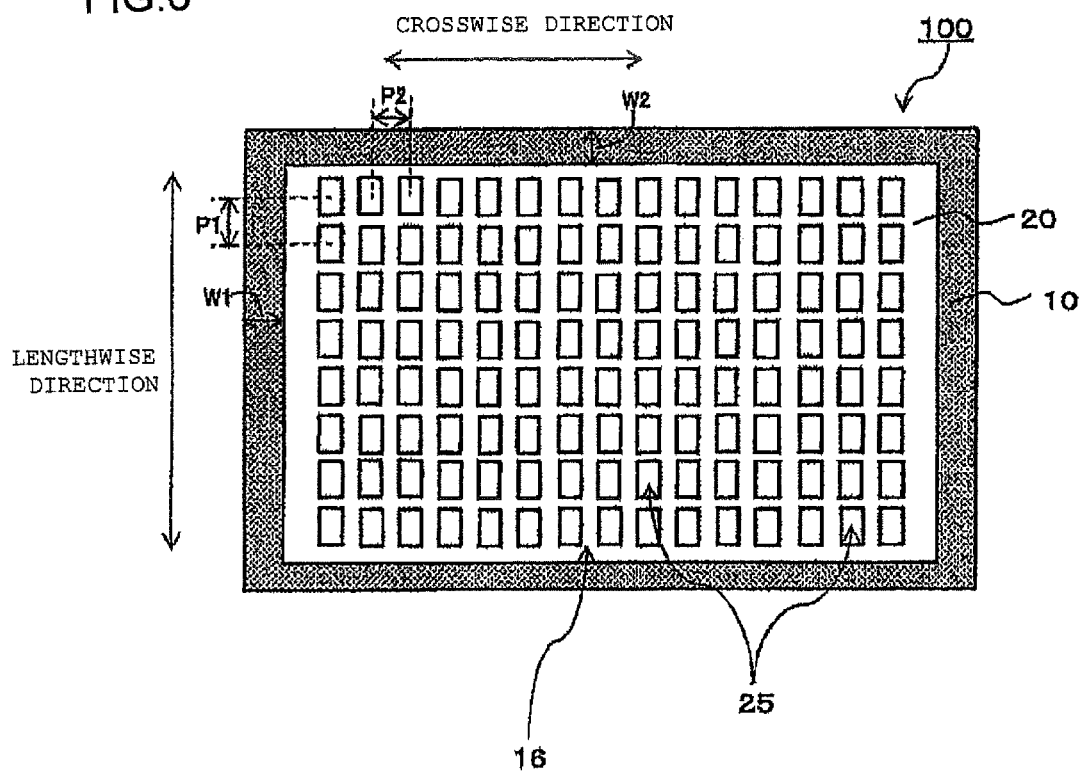
FIG. 6 is a top view of the vapor deposition mask of Embodiment (B) prepared in the preparing step as seen from the metal mask side.

Next, the vapor deposition mask of Embodiment (B) is described. As shown in FIG. 6, the vapor deposition mask of Embodiment (B) includes the metal mask 10 in which one slit (one hole 16) is provided and the resin mask 20 in which the plurality of openings 25 corresponding to a pattern to be produced by vapor deposition are provided, the metal mask being stacked on one surface of resin mask, wherein all of the plurality of openings 25 are provided at a position overlapping with the one hole 16 provided in the metal mask 10.

The opening 25 stated for the vapor deposition mask of Embodiment (B) means an opening needed for forming the vapor deposition pattern on the vapor deposition target. An opening not needed for forming the vapor deposition pattern on the vapor deposition target may be provided at a position of not overlapping with the one hole 16. Notably, FIG. 6 is a top view which exemplarily shows the vapor deposition mask of Embodiment (B) and is of the vapor deposition mask as seen from the metal mask side.

In the vapor deposition mask 100 of Embodiment (B), the metal mask 10 having the one hole 16 is provided on the resin mask 20 having the plurality of openings 25, and all of the plurality of openings 25 are provided at a position overlapping with the one hole 16. In the vapor deposition mask 100 of Embodiment (B) that has this configuration, metal line portions that have the same thickness as the thickness of the metal mask or a larger thickness than the thickness of the metal mask do not exist between the openings 25. Hence, as described for the aforementioned vapor deposition mask of Embodiment (A), the vapor deposition pattern with high definition can be formed to match the dimensions of the openings 25 provided in the resin mask 20 without suffering interference of metal line portions.

Moreover, according to the vapor deposition mask of Embodiment (B), there is almost no influence of a shadow even when the thickness of the metal mask 10 is made large. Hence, the thickness of the metal mask 10 can be made larger to such an extent that durability and handling ability are sufficiently satisfied. While a vapor deposition pattern with high definition can be formed, durability and handling ability can be improved.

The resin mask 20 in the vapor deposition mask of Embodiment (B) is composed of resin, in which as shown in FIG. 6, the plurality of openings 25 corresponding to a pattern to be produced by vapor deposition are provided at a position overlapping with the one hole 16. The openings 25 correspond to the pattern to be produced by vapor deposition. By a vapor deposition material released from a vapor deposition source passing through the openings 25, the vapor deposition pattern corresponding to the openings 25 is formed on the vapor deposition target. Notably, while in the mode shown in the figure, the openings arranged in a plurality of rows in the lengthwise direction and the crosswise direction are exemplarily described, they may be arranged only in the lengthwise direction or in the crosswise direction.

"One screen" in the vapor deposition mask 100 of Embodiment (B) means an aggregate of openings 25 corresponding to one product. When the one product is an organic EL display, an aggregate of organic layers needed for forming one organic EL display, in other words, an aggregate of openings 25 to be the organic layers is "one screen". While the vapor deposition mask of Embodiment (B) may be constituted of only "one screen" or may be provided by arranging the "one screen" for each of a plurality of screens, in the case where the "one screen" is arranged for each of the plurality of screens, the openings 25 are preferably provided at predetermined intervals on a screen-by-screen basis (refer to FIG. 5 for the vapor deposition mask of Embodiment (A)). The mode of "one screen" is not specially limited but, for example, the one screen can also be composed of millions of openings 25, where one opening 25 is one pixel.

The metal mask 10 in the vapor deposition mask 100 of Embodiment (B) is composed of metal and includes the one hole 16. Further, in an embodiment of the present invention, the one hole 16 is disposed at a position overlapping with all of the openings 25 as seen head-on of the metal mask 10, in other words, at a position where all of the openings 25 arranged in the resin mask 20 can be seen.

Figure 7:
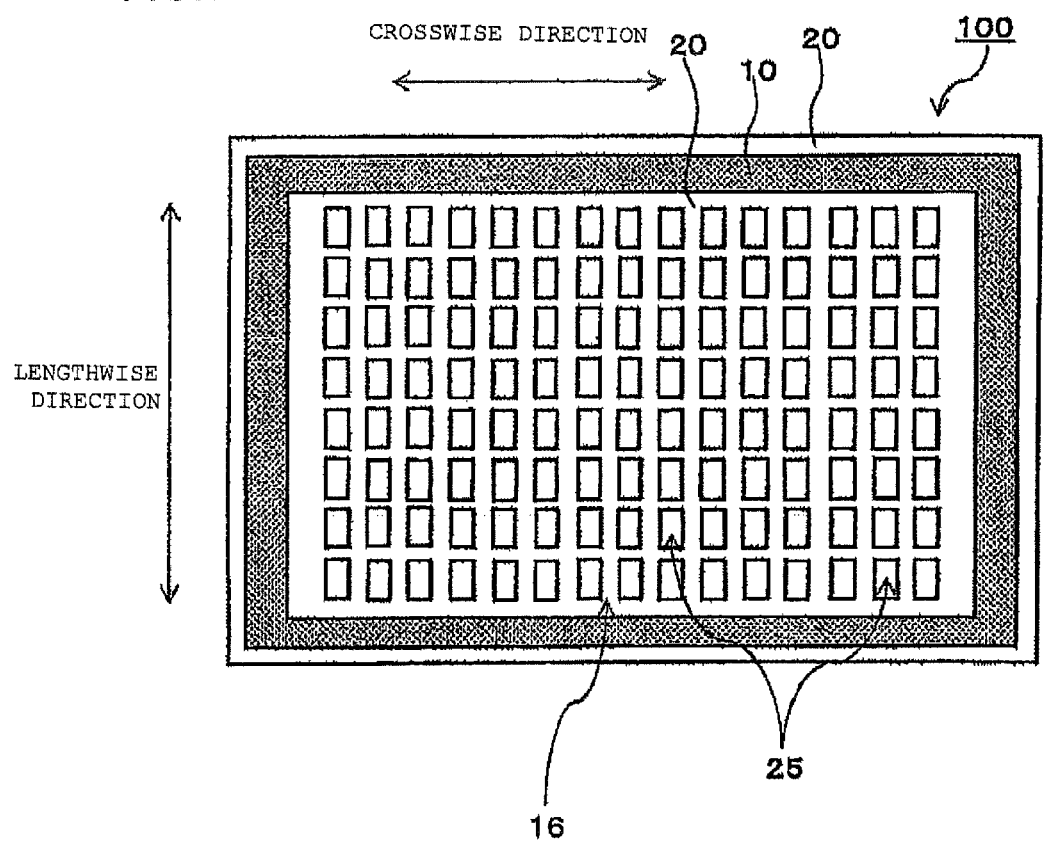
FIG. 7 is a top view of the vapor deposition mask of Embodiment (B) prepared in the preparing step as seen from the metal mask side.

The metal portion composing the metal mask 10, that is, the portion thereof other than the one hole 16 may be provided along the outer edge of the vapor deposition mask 100 as shown in FIG. 6, or the dimension of the metal mask 10 may be made smaller than that of the resin mask 20 to expose an outer circumferential portion of the resin mask 20 as shown in FIG. 7. Moreover, the dimension of the metal mask 10 may be made larger than that of the resin mask 20, so that a part of the metal portion is caused to protrude outward in the crosswise direction of the resin mask or outward in the lengthwise direction thereof. Notably, in any cases, the dimension of the one hole 16 is configured to be smaller than the dimension of the resin mask 20.

While a width (W1), in the crosswise direction, and a width (W2), in the lengthwise direction, of the metal portion constituting the wall surface of the one hole 16 of the metal mask 10 shown in FIG. 6 are not specially limited, as the width W1, W2 is made smaller, durability and handling ability tend to deteriorate more. Accordingly, W1 and W2 are preferably widths by which durability and handling ability are sufficiently satisfied. While appropriate widths can be properly set depending on the thickness of the metal mask 10, as an example of preferable widths, both W1 and W2 are about 1 mm to about 100 mm, which are the same widths of the metal mask in the vapor deposition mask of Embodiment (A).

Hereafter, the method for producing a vapor deposition mask prepared in the present step is exemplarily described. The vapor deposition mask 100 prepared in the preparing step can be obtained by preparing the resin plate-equipped metal mask in which the metal mask 10 provided with the slits 15 is stacked on one surface of the resin plate, and next, irradiating the resin plate-equipped metal mask with laser through the slits 15 from the metal mask 10 side to form the openings 25 corresponding to a pattern to be produced by vapor deposition in the resin plate.

As a method of forming the resin plate-equipped metal mask, the metal mask 10 provided with the slits 15 is stacked on one surface of the resin plate. The resin plate can employ the materials described for the aforementioned resin mask 20.

As the method for forming the metal mask 10 in which the slits 15 are provided, a masking member, for example, a resist material is applied onto the surface of the metal plate, predetermined portions thereof are exposed and developed, and thereby, a resist pattern in which positions where the slits 15 are finally to be formed remain is formed. The resist material used as the masking member is preferably excellent in processing ability with desired resolution. Next, etching processing is performed by an etching method using the resist pattern as an etching resistant mask. After the completion of the etching, the resist pattern is cleaned and removed. In this way, the metal mask 10 in which the slits 15 are provided is obtained. The etching for forming the slits 15 may be performed on one surface side of the metal plate or may be performed on both surfaces thereof. Moreover, in the case where the slits 15 are formed in the metal plate using the stacked body in which the resin plate is provided on the metal plate, the masking member is applied onto the surface of the metal plate on the side that is not in contact with the resin plate, and the slits 15 are formed by the etching from one surface side. Notably, in the case where the resin plate has etching resistance with respect to the etching agent for the metal plate, masking of the surface of the resin plate is not needed but, in the case where the resin plate does not have resistance with respect to the etching agent for the metal plate, the masking member is needed to be applied onto the surface of the resin plate. Moreover, in the above, while the resist material is mainly described as the masking member, in place of the application of the resist material, a dry film resist may be laminated to perform the similar patterning.

In the aforementioned method, the resin plate composing the resin plate-equipped metal mask may be a resin layer or a resin film formed by coating as well as a plate-shaped resin. In other words, the resin plate may be beforehand prepared. In the case of forming the resin plate-equipped metal mask using the metal plate and the resin plate, the resin layer or the resin film to be the resin mask in the final stage can also be formed on the metal plate by a conventionally known coating method or the like.

As a method for forming the openings 25, the resin plate is penetrated using a laser processing method, fine press processing, photolithography processing or the like on the resin plate-equipped metal mask prepared above to form the openings 25 corresponding to the pattern to be produced by vapor deposition in the resin plate. Thereby, the vapor deposition mask 100 of an embodiment is obtained in which the metal mask 10 provided with the slits 15 is stacked on one surface of the resin mask 20 in which the openings 25 corresponding to the pattern to be produced by vapor deposition are provided. Notably, in view of capability of easily forming the openings 25 with high definition, the laser processing method is preferably used for the formation of the openings 25.

While in the vapor deposition mask 100 in the mode shown in each figure, the shape of the vapor deposition mask in plan view exhibits a rectangular shape, the shape of the vapor deposition mask in plan view is not limited to this shape but any shapes such, for example, as a circular shape and a polygonal shape can be cited.

Stretching Step

A stretching step is a step of retaining a part of the vapor deposition mask 100 prepared in the preparing step by the retainer 80 and stretching the vapor deposition mask retained by the retainer 80 outward thereof. In the stretching step by way of example, opposite two sides of the vapor deposition mask prepared in the preparing step are retained by the retainer 80 and at least one of the retainers 80 is pulled outward of the vapor deposition mask. For example, a driving device such as a motor and an air cylinder joined with the retainer 80 is actuated and the vapor deposition mask 100 retained by the retainer 80 is stretched outward thereof.

Then, in the stretching step, the method for producing a frame-equipped vapor deposition mask of an embodiment is characterized in that a part of the vapor deposition mask 100 is retained by the retainer 80 and any one or both adjustments of a rotating adjustment and a moving adjustment of the vapor deposition mask are performed with the vapor deposition mask retained by the retainer 80 being stretched outward thereof or with respect to the vapor deposition mask in the state of being stretched.

While a retaining position of the vapor deposition mask 100 by the retainer 80 is not limited, the vicinity of the end part of the vapor deposition mask 100 is typically the retaining position of the vapor deposition mask 100 by the retainer 80. To retain the vapor deposition mask 100 by the retainer 80 may be performed using only one retainer 80 or may be performed using a plurality of retainers 80.

Hereafter, specific devices for implementing the rotating adjustment and the moving adjustment in the stretching step are described, exemplified by mechanisms included in the retainer 80. Notably, the rotating adjustment and the moving adjustment may be implemented by others other than the devices described below.

In the stretching step by way of example, the retainer 80 retaining a part of the vapor deposition mask 100 includes at least one mechanism of a first rotating mechanism rotatable with a first rotational axis intersecting a surface of the vapor deposition mask 100 being as an axis (hereinafter sometimes referred to simply as first rotating mechanism), a second rotating mechanism rotatable with a second rotational axis not intersecting the surface of the vapor deposition mask 100 being as an axis (hereinafter sometimes referred to simply as second rotating mechanism), and a linearly movable moving mechanism (hereinafter sometimes referred to simply as moving mechanism), and any one or both adjustments of the rotating adjustment and the moving adjustment of the vapor deposition mask 100 are performed by the retainer 80.

The surface of the vapor deposition mask intersecting the first rotational axis and the surface of the vapor deposition mask not intersecting the second rotational axis stated in the present specification mean regions each of which includes three points arbitrarily selected from the whole surface of the vapor deposition mask.

As to the aforementioned first rotating mechanism, while an angle formed by the surface of the vapor deposition mask and the first rotational axis is not specially limited as long as the condition of being rotatable with the first rotational axis intersecting the surface of the vapor deposition mask being as an axis is satisfied, it is preferably about 45° to about 135°, still preferably about 85° to about 95°, particularly preferably 90°.

As to the aforementioned moving mechanism, while its moving direction is not specially limited as long as the condition of being linearly movable is satisfied, an angle formed by an axis of the direction in which the vapor deposition mask is stretched and an axis of the direction in which the retainer 80 moves is preferably about 45° to about 135°, still preferably about 85° to about 95°, particularly preferably 90°.

Specific examples of the aforementioned retainer 80 can include the retainer 80 including at least one mechanism of the first rotating mechanism rotatable with the first rotational axis perpendicular to the surface of the vapor deposition mask 100 being as an axis, the second rotating mechanism rotatable with the second rotational axis parallel to the surface of the vapor deposition mask being as an axis, and the moving mechanism movable in the direction perpendicular to the direction in which the vapor deposition mask is stretched and the similar member.

When the stretching step is described, while "occurrence of twist" in the occasion when the vapor deposition mask is stretched without the rotating adjustment or the moving adjustment performed, for example, occurrence of "twist" in the occasion when the vapor deposition mask is stretched using a retainer not including any of the aforementioned first rotating mechanism, second rotating mechanism and moving mechanism (hereinafter sometimes referred to as conventional retainer) is being mentioned, an embodiment of the present invention in which the vapor deposition mask is stretched using a retainer including at least one mechanism of the aforementioned first rotating mechanism, second rotating mechanism and moving mechanism is described. Notably, FIG. 8(a) and FIG. 9(a) are top views each of which shows a state where "twist" arises in the vapor deposition mask after the stretching step. FIG. 8(b) and FIG. 9(b) are top views each of which shows a state where "twist"

in the vapor deposition mask is suppressed by stretching the vapor deposition mask using the retainer characterized as mentioned above. Notably, in FIG. 8 and FIG. 9, the openings 25 and the slits 15 in the vapor deposition mask are omitted from the illustration. Moreover, "twist" is exaggerated in the figures.

The "twist" stated in the present specification is a concept including wave-like wrinkles, distortion and the like arising in the vapor deposition mask in the occasion when the vapor deposition mask is stretched. Moreover, to "stretch the vapor deposition mask" stated in the present specification means to exert external force (tensile force) thereon in the direction in which the vapor deposition mask 100 prepared above is extended.

Moreover, the "retainer" stated in the present specification means a member retainable of a part of the vapor deposition mask, for example, a side of the vapor deposition mask with any device. A mode of retaining the vapor deposition mask is not specially limited but, for example, when a clamp is used as the retainer, the vapor deposition mask is retained by clamping an end part or the like of the vapor deposition mask with the clamp. Moreover, when a member such as a metal plate and a resin plate is used as the retainer, the vapor deposition mask is retained by pasting the member and the end part of the vapor deposition mask together with an adhesive agent or fixing the member and the end part of the vapor deposition mask to each other by welding or the like. Moreover, when a magnetic member having magnetism is used as the retainer, the vapor deposition mask is retained by allowing the magnetic member and the metal mask positioned in the vicinity of the end part of the vapor deposition mask to attract each other using magnetic force. The vapor deposition mask can also be retained in a mode other than these. Notably, in the case where the retaining force of the vapor deposition mask by the retainer is weak, the vapor deposition mask retained by the retainer 80 is sometimes displaced from the original retaining position when stretched outward thereof. Hence, the retaining force of the vapor deposition mask by the retainer is needed to have retaining force to such an extent that the retaining position is not displaced when the vapor deposition mask is stretched. With the retaining force and simpleness in retaining the vapor deposition mask taken into consideration, the clamp is preferably used as the retainer. Notably, in modes shown in the figures, the description is made, exemplified by the cases where the retainer 80 is the clamp.

Figure 8:
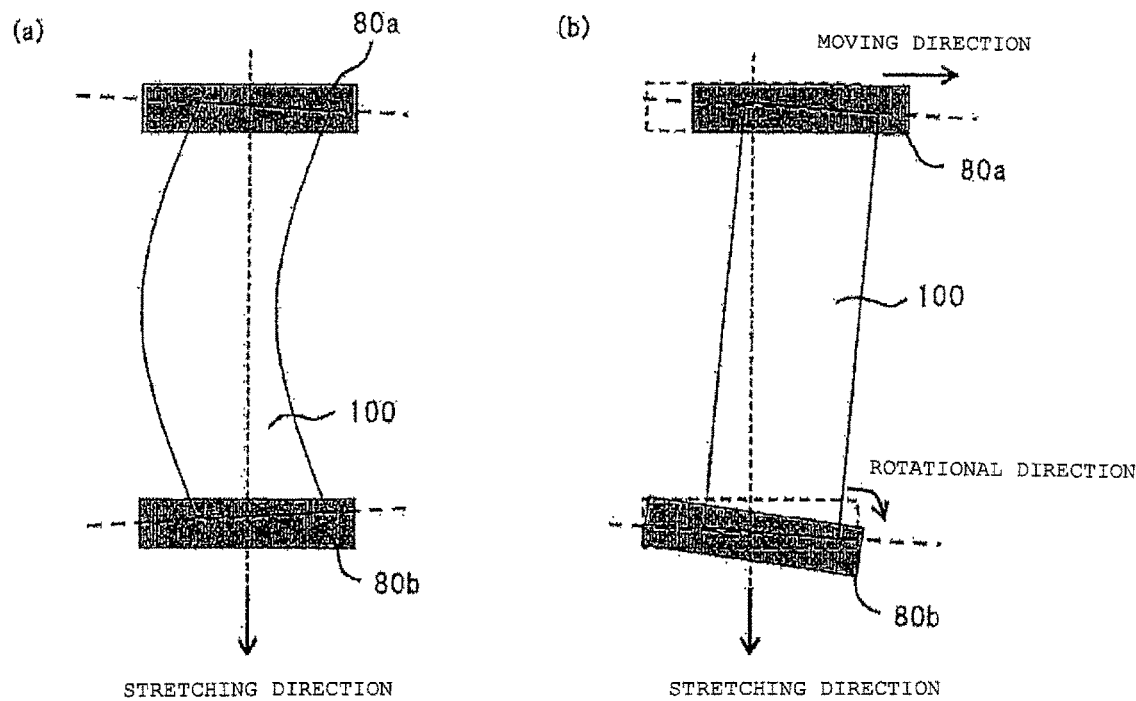
FIG. 8 are top views exemplarily showing the vapor deposition mask stretched in a stretching step, portion (a) is a top view showing a state where "twist" arises in the vapor deposition mask and portion (b) is a top view showing a state where "twist" in the vapor deposition mask is suppressed.

In the case where the vapor deposition mask is not correctly retained by the retainer when the vapor deposition mask is stretched using the aforementioned conventional retainer, for example, in the case where both ends of the vapor deposition mask 100 are asymmetrically retained despite both ends of the vapor deposition mask 100 are parallelly retained by the retainer 80, "twist" is to arise in the vapor deposition mask 100 when the vapor deposition mask is stretched by operating a driving device such as a motor and an air cylinder joined with the retainer 80 (refer to FIG. 8(*a*)). Moreover, also in the case where both ends of the vapor deposition mask are not parallelly retained by the retainer 80, namely, in the case where the vapor deposition mask 100 is retained by the retainer 80 in the state of being obliquely inclined, "twist" arises in the vapor deposition mask 100 by stretching the vapor deposition mask (refer to FIG. 9(*a*)).

Since the resin mask 20 constituting the vapor deposition mask 100 prepared in the aforementioned preparing step is composed of resin material, while it has an advantage that the openings 25 with high definition can be formed, it has a problem that the dimension of the openings 25 tends to suffer variation due to stress exerted from the outside or the like. Further, when "twist" arises in the vapor deposition mask 100 in the stretching step, the dimension of the openings 25 formed in the resin mask 20 tends to suffer variation, which is an obstacle in the occasion when the vapor deposition pattern with high definition is formed using the frame-equipped vapor deposition mask.

In the method for producing a frame-equipped vapor deposition mask of an embodiment, any one or both adjustments of the rotating adjustment and the moving adjustment of the vapor deposition mask 100 are performed with respect to the stretched vapor deposition mask 100 or with the vapor deposition mask 100 being stretched, and thereby, "twist" which can arise due to stretching the vapor deposition mask is suppressed. In the method for producing a frame-equipped vapor deposition mask by way of example, a part of the vapor deposition mask is retained by the retainer 80 including at least one of the aforementioned first rotating mechanism, second rotating mechanism and moving mechanism, and the vapor deposition mask 100 retained by the retainer 80 is stretched outward thereof. According to this example, operation of the mechanism included in the retainer 80 enables the vapor deposition mask to be stretched in the state of suppressing "twist" which can arise in the vapor deposition mask. Specifically, in the present step, the retainer 80 performs any one or both adjustments of the rotating adjustment and the moving adjustment of the vapor deposition mask 100 with respect to the stretched vapor deposition mask 100 or with the vapor deposition mask 100 being stretched, and thereby, suppresses "twist" which can arise due to stretching the vapor deposition mask. Hereafter, the aforementioned first rotating mechanism, second rotating mechanism and the moving mechanism are sometimes collectively referred to as "mechanism in an embodiment of the present invention". Moreover, the "rotating adjustment" stated in the present specification means an adjustment of suppressing the aforementioned "twist" by rotating the vapor deposition mask using the first rotating mechanism or the second rotating mechanism. The "moving adjustment" means an adjustment of suppressing the aforementioned "twist" by moving the vapor deposition mask using the aforementioned moving mechanism.

Figure 10:
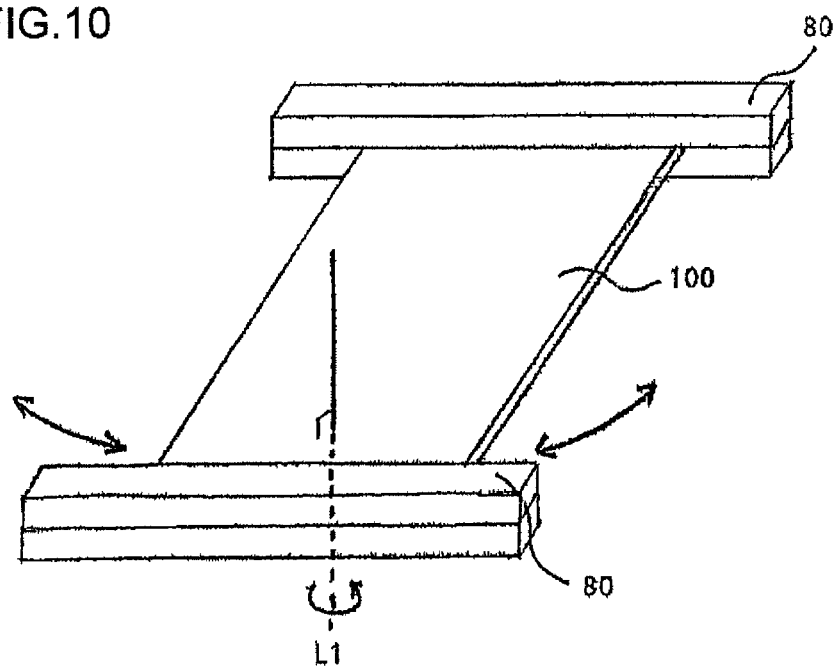
FIG. 10 is a perspective view for explaining a first rotating mechanism.
Figure 11:
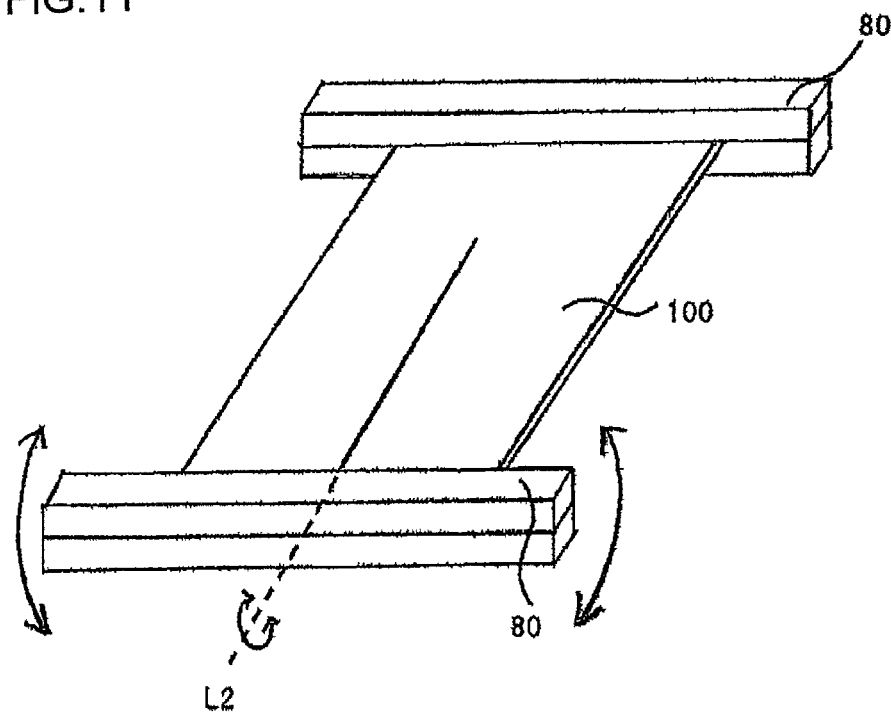
FIG. 11 is a perspective view for explaining a second rotating mechanism.
Figure 12:
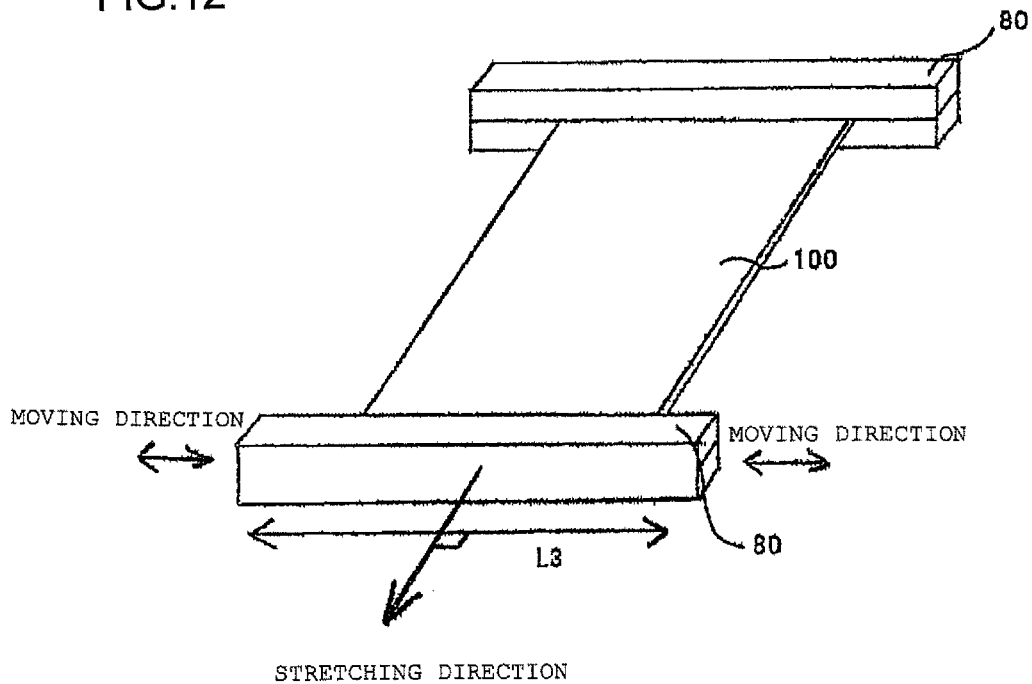
FIG. 12 is a perspective view for explaining a moving mechanism.

FIG. 10 is a perspective view showing a state where the retainer 80 is rotated by the retainer 80 including the first rotating mechanism. The mode shown in the figure has a configuration in which the retainer 80 is rotated in the direction of the arrows with the first rotational axis (L1) perpendicular to the surface of the vapor deposition mask 100 being as an axis. FIG. 11 is a perspective view showing a state where the retainer 80 is rotated by the retainer 80 including the second rotating mechanism. The mode shown in the figure has a configuration in which the retainer 80 is rotated in the direction of the arrows with the second rotational axis (L2) parallel to the surface of the vapor deposition mask 100 being as an axis. FIG. 12 is a perspective view showing a state where the retainer 80 is moved by the retainer 80 including the moving mechanism. The mode shown in the figure has a configuration movable in the direction (L3 direction) perpendicular to the direction in which the vapor deposition mask is stretched. In FIG. 10 to FIG. 12, the openings 25 and the slits 15 in the vapor deposition mask 100 are omitted from the illustration.

The first rotational axis and the second rotational axis are not limited to the modes shown in the figures but, as described above, the axis intersecting the surface of the vapor deposition mask is sufficient to be the first rotational axis and the axis not intersecting the surface of the vapor deposition mask to be the second rotational axis. Notably, FIG. 10 to FIG. 12 are preferable modes of the mechanisms included in the retainers.

In the retainer in the preferable mode, the axis perpendicular to the surface of the vapor deposition mask is the first rotational axis, the axis parallel to the surface of the vapor deposition mask is the second rotational axis, and the direction perpendicular to the direction in which the vapor deposition mask is stretched is the moving direction. Nevertheless, in the present specification, the description of being perpendicular to the surface of the vapor deposition mask 100 and the description of being perpendicular to the direction in which the vapor deposition mask is stretched do not necessarily mean the angle of 90° with respect to the surface of the vapor deposition mask and the direction in which the vapor deposition mask is stretched, but an angle within a range in which effects of an embodiment of the present invention are achieved is also allowed. In other words, an angle by which the vapor deposition mask can be rotated is sufficient and components perpendicular to the surface of the vapor deposition mask and the direction in which the vapor deposition mask is stretched are sufficient to be included, to such an extent that "twist" of the vapor deposition mask can be suppressed. Moreover, the description of being parallel to the surface of the vapor deposition mask do not necessarily mean the angle of 0° with respect to the surface of the vapor deposition mask, but an angle within a range in which effects of an embodiment of the present invention are achieved is also allowed. In other words, an angle by which the vapor deposition mask can be moved is sufficient and a component parallel to the surface of the vapor deposition mask is sufficient to be included, to such an extent that "twist" of the vapor deposition mask can be suppressed.

The method for producing a frame-equipped vapor deposition mask of an embodiment takes it as an essential condition that the retainer retaining a part of the vapor deposition mask includes at least one mechanism of the aforementioned "mechanisms in an embodiment of the present invention". Examples of a preferable mode thereof can include modes in which opposite two sides of the vapor deposition mask are retained by independent retainers 80, (i) the retainer 80 that retains one side of the opposite two sides of the vapor deposition mask includes any one or both of the first rotating mechanism and the second rotating mechanism and the retainer 80 that retains the other side includes the moving mechanism, or (ii) the retainer 80 that retains one side of the opposite two sides of the vapor deposition mask includes any one or both of the first rotating mechanism and the second rotating mechanism and the moving mechanism, and the like. In the mode shown by item (ii), the retainer 80 that retains the other side of the vapor deposition mask is not necessarily needed to include the aforementioned "mechanism in an embodiment of the present invention". The modes shown by items (i) and (ii) are preferable in that "twist" which can arise in the vapor deposition mask in the stretching step can be universally suppressed. In other words, even when "twist" arises in any direction in stretching the vapor deposition mask, the "twist" can be relieved. Moreover, "twist" can be often suppressed by the retainer including the first rotating mechanism, and accordingly, the rotating mechanism is preferably the retainer including the first rotating mechanism. Hereafter, suppression of "twist" which can arise in the stretching step is described, exemplified by a retainer including the aforementioned "mechanism in an embodiment of the present invention".

Figure 9:
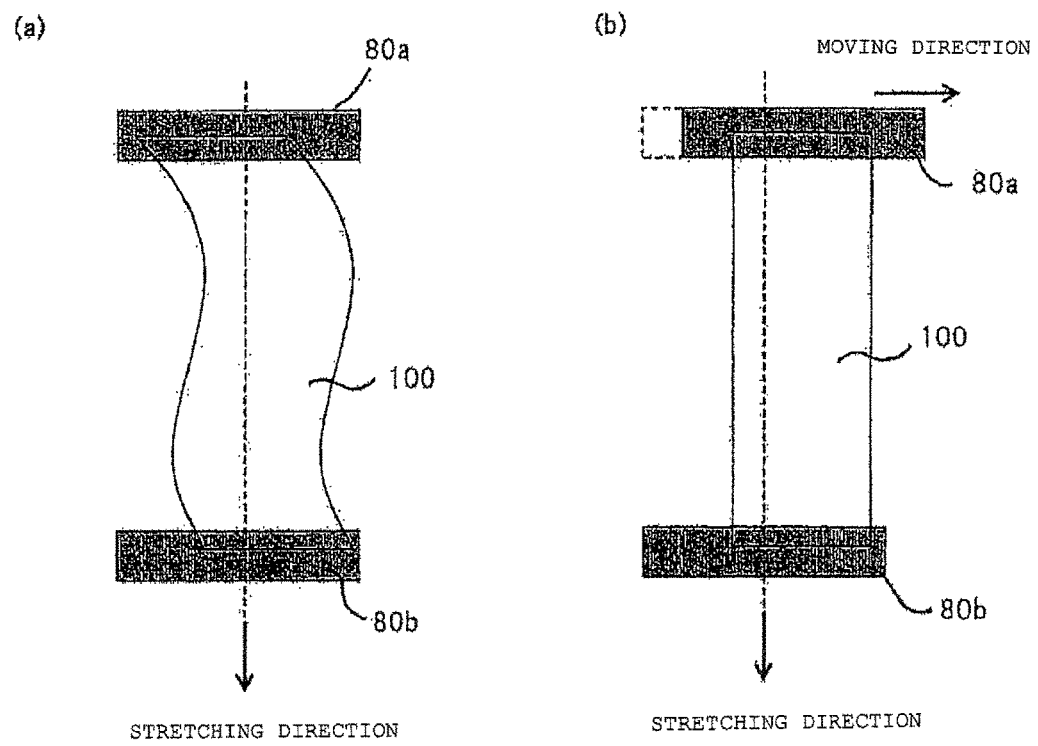
FIG. 9 are top views exemplarily showing the vapor deposition mask stretched in the stretching step, portion (a) is a top view showing a state where "twist" arises in the vapor deposition mask and portion (b) is a top view showing a state where "twist" in the vapor deposition mask is suppressed.

While in FIG. 8(a) and FIG. 9(a), "twist" arises in the vapor deposition mask 100 by stretching the vapor deposition mask 100, the vapor deposition mask 100 can be stretched in the state where "twist" is suppressed as shown in FIG. 8(b) and FIG. 9(b) by giving the moving mechanism to a retainer 80a shown in FIG. 8, giving the first rotating mechanism to a retainer 80b, moving the retainer 80a in the direction of the arrow and rotating the retainer 80b in the direction of the arrow, and moreover, by giving the moving mechanism to the retainer 80a shown in FIG. 9 and moving the retainer 80a in the direction of the arrow.

In the stretching step, the retainer 80 retains a part of the vapor deposition mask to stretch the vapor deposition mask 100 outward thereof, and performs any one or both adjustments of the rotating adjustment and the moving adjustment of the vapor deposition mask 100 by the aforementioned "mechanism in an embodiment of the present invention" included in the retainer 80 with the vapor deposition mask being stretched or after stretched. Further, this adjustment suppresses "twist" which can arise due to stretching the vapor deposition mask 100. While more specific embodiments which can suppress "twist" are hereafter exemplarily described, an embodiment of the present invention is not limited to these modes.

Figure 13:
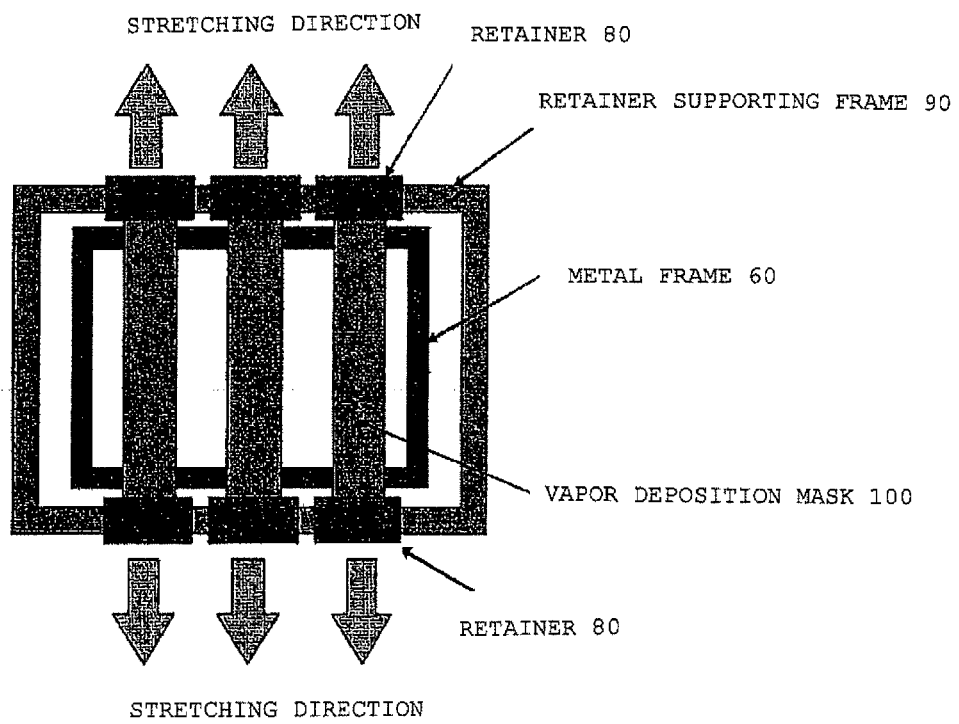
FIG. 13 is a top view for explaining the stretching step.

FIG. 13 is a top view showing a state in the occasion when the vapor deposition masks 100 are stretched and the vapor deposition masks 100 in the state of being stretched are fixed onto a frame 60. In the mode shown in the figure, the retainers 80 including the "mechanisms in an embodiment of the present invention" are provided on a retainer supporting frame 90. The retainers 80 including the "mechanisms in an embodiment of the present invention" are rotatable and/or movable with respect to the retainer supporting frame 90.

As an embodiment in which "twist" can be suppressed with the vapor deposition mask being stretched, modes in which a revolute pair, a rectilinear pair, a sliding pair and the like such as bearings (ball bearings) are installed in the retainers 80 and the retainers 80 are passively rotated in accordance with force (tensile force) which the vapor deposition mask receives in the stretching step can be cited. According to these modes, the retainers 80 passively undergo movement, rotation and the like, and as a result, the vapor deposition mask can be stretched while "twist" is suppressed.

Figure 14:
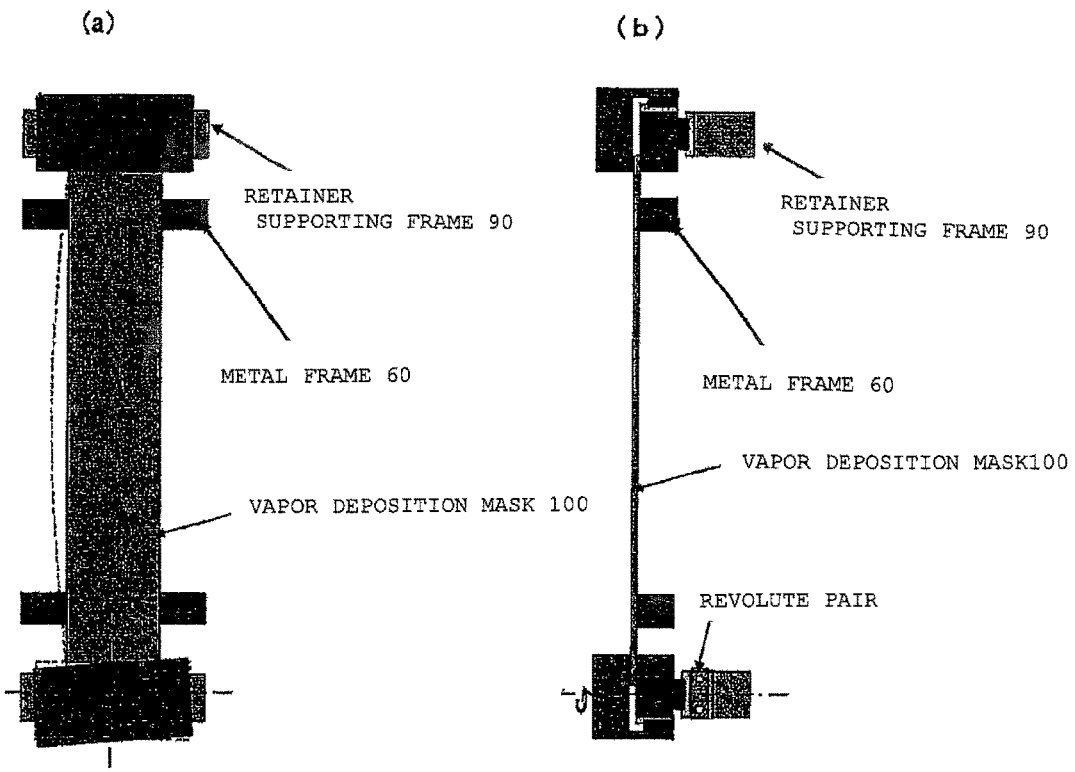
FIG. 14 portion (a) is a top view for explaining the stretching step and portion (b) is an elevation view thereof.

FIG. 14(a) is a partially expanded top view showing a state where "twist" is suppressed with the vapor deposition mask 100 being stretched by the retainer 80 in which the revolute pair is provided. FIG. 14(b) is an elevation view of FIG. 14(a). In the mode shown in FIG. 14, the retainer 80 is rotatable by the retainer 80 in which the revolute pair is provided with the first rotational axis intersecting the surface of the vapor deposition mask being as an axis, for example, with the first rotational axis perpendicular to the surface of the vapor deposition mask 100 being as an axis (in the mode shown in the figure, with a rotational axis perpendicular to the retainer 80 in which the revolute pair is provided being as an axis). Regions enclosed by broken lines in FIG. 14(a) are the vapor deposition mask in the occasion when "twist" is not suppressed and the retainer before rotation, respectively. Moreover, using a rectilinear pair, the retainer 80 can be configured to be movable.

As an embodiment in which "twist" is suppressed after the vapor deposition mask is stretched, a mode in which "twist" which arises due to stretching the vapor deposition mask 100 is mechanically controlled can be cited. For example, "twist" arising in the occasion when the vapor deposition mask 100 is stretched can be suppressed by connecting the retainer 80 and a control device such as a motor together via a torque sensor or the like (not shown), detecting torque of the retainer 80 arising due to "twist" in the occasion when the vapor deposition mask is stretched with the torque sensor or the like, and controlling a movement amount (distance) or a rotational angle of the retainer 80 with the control device such as a motor such that the torque becomes 0. In other words, "twist" which arises due to stretching the vapor deposition mask 100 can be actively controlled, and as a result, the "twist" can be suppressed. In this mode, the retainer 80 in which the control device is provided is rotated with the rotational axis perpendicular to the retainer 80 in which the control device such as a motor is provided being as an axis.

Figure 15:
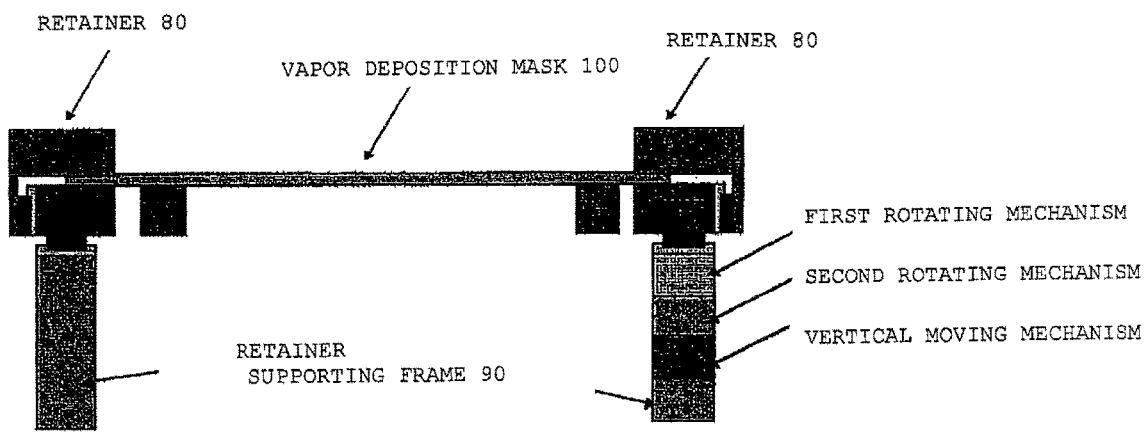
FIG. 15 is an elevation view for explaining the stretching step.

Moreover, the mode in which "twist" is suppressed with the vapor deposition mask 100 being stretched and the mode in which "twist" is suppressed after the vapor deposition mask is stretched can also be combined. Moreover, as shown in FIG. 15, there can be a combination of any mechanisms by stacking various mechanisms (in the mode shown in the figure, the moving mechanism, the second rotating mechanism and the first rotating mechanism) on the retainer supporting frame 90 and fixing the mechanisms to the retainer. For example, using the aforementioned revolute pair as the first rotating mechanism and using the control device such as a motor as the second rotating mechanism and the moving mechanism, "twist" arising in the occasion when the vapor deposition mask is stretched can be actively suppressed by the second rotating mechanism and the moving mechanism while passively suppressed with the first rotating mechanism. Moreover, in the mode shown in FIG. 15, the torque sensor or the like described above may be provided between the first rotating mechanism and the retainer 80.

Figure 16:
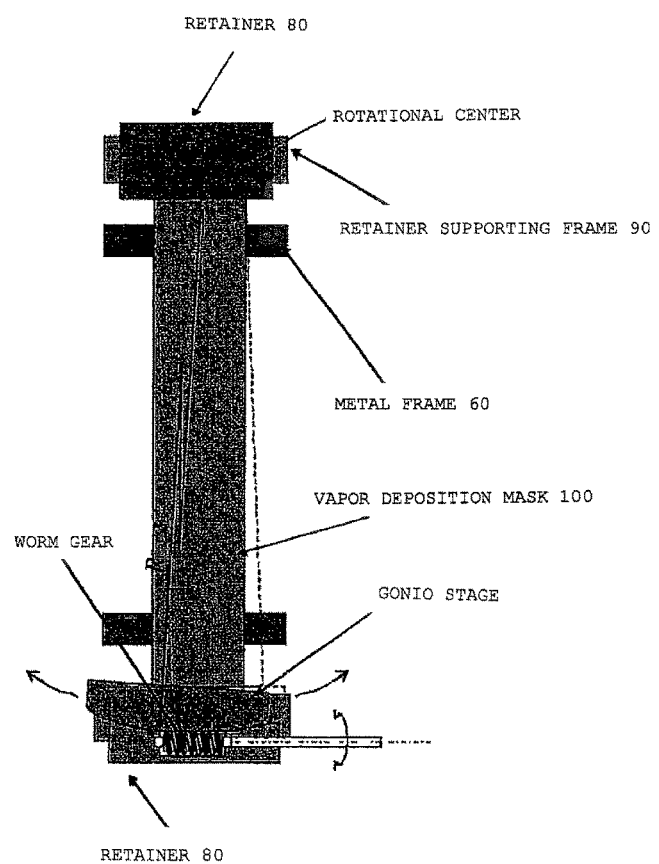
FIG. 16 is a top view for explaining the stretching step.

In the mode shown in FIG. 16, the retainer 80 is fixed to a gonio stage, the gonio stage is swung (moved) with the rotational axis perpendicular to the retainer 80 that does not include the gonio stage being as an axis by rotating the shaft of the worm gear fixed to the retainer supporting frame 90, and "twist" of the vapor deposition mask 100 retained by the retainers 80 is suppressed. Specifically, the torque sensor or the like detects the torque of the retainer 80 arising due to "twist" in the occasion when the vapor deposition mask is stretched using the torque sensor or the like, the swing (movement) of the gonio stage is controlled by rotating the shaft of the worm gear such that the torque becomes 0, and thereby, the "twist" of the vapor deposition mask can be suppressed.

The driving device for driving the retainer 80 is not specially limited but, for example, a motor, an air cylinder and the like can be cited. A driving device 85 is connected to the retainer 80 at a position of not interfering to the mechanism by the "mechanism in an embodiment of the present invention", and drive of the driving device drives the retainer 80 to stretch the vapor deposition mask 100.

Figure 17:
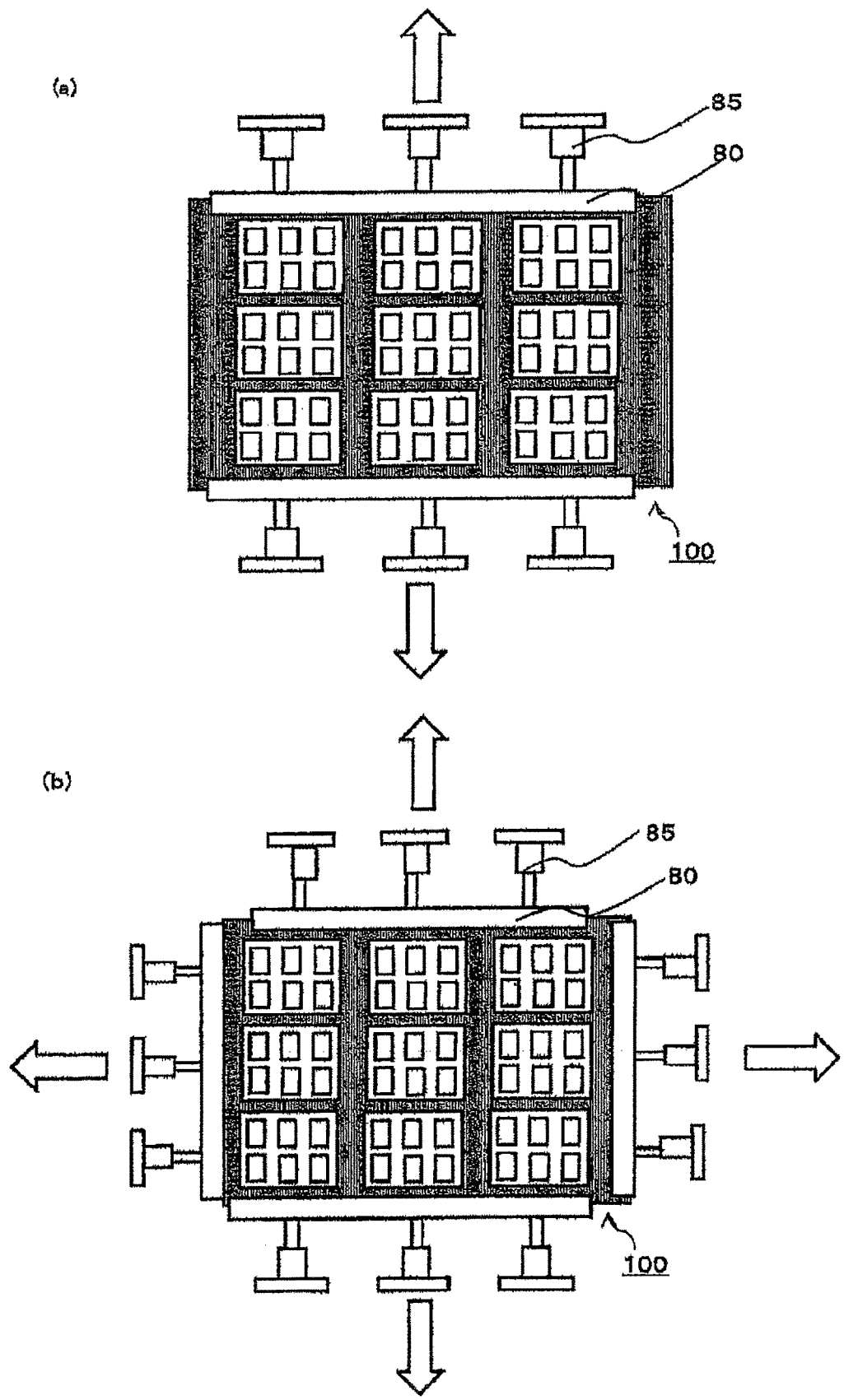
FIG. 17 presents top views for explaining the stretching step.

FIG. 17 is a plan view showing a state where tensile force is exerted on the vapor deposition mask 100 retained by the retainers 80, and the vapor deposition mask is stretched by exerting the tensile force outward in the lengthwise direction in portion (a) and by exerting the tensile force outward in the lengthwise direction and the crosswise direction in portion (b). The direction in which the tensile force is exerted is not limited to the modes shown in the figure but the tensile force may be exerted outward in the crosswise direction. Moreover, the tensile force may be exerted in a direction other than these, for example, in an oblique direction. Moreover, while in FIG. 17(a), both retainers 80 are driven outward in the lengthwise direction, only one of the retainers 80 may be driven. Notably, also in this case, any one retainer 80 of the retainer 80 driven outward and the retainer 80 not driven outward is sufficient to include the aforementioned "mechanism in an embodiment of the present invention".

Figure 18:
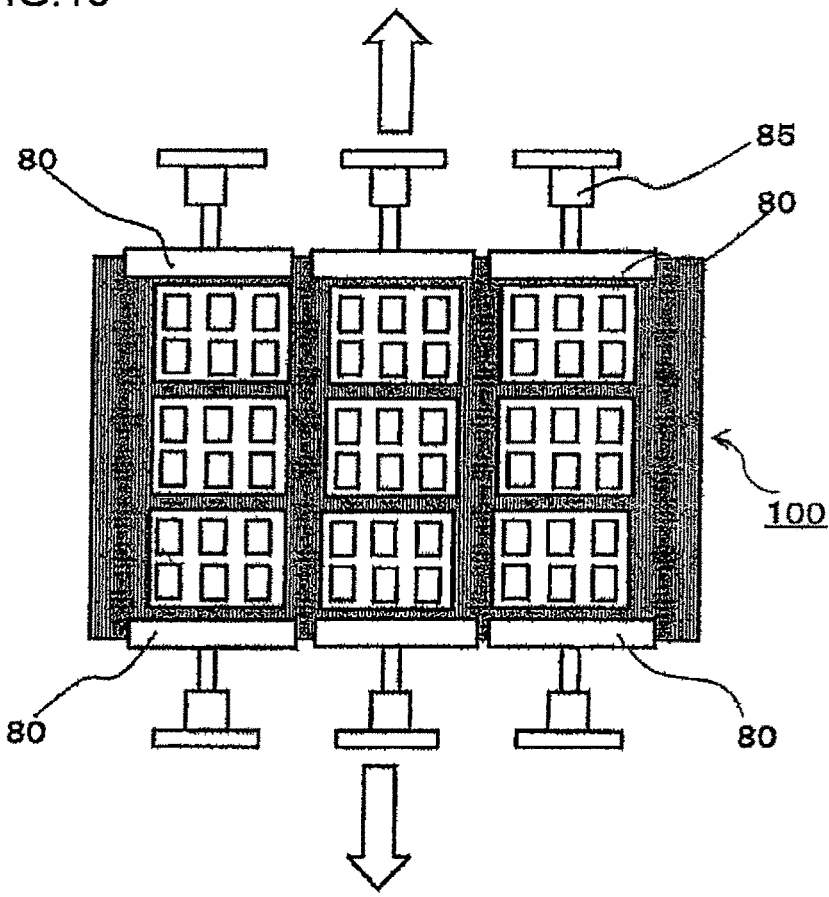
FIG. 18 is a top view for explaining the stretching step.

While in the mode shown in FIG. 17, one side of the opposite two sides of the vapor deposition mask is retained by one retainer 80, as shown in FIG. 18, the one side of the opposite two sides of the vapor deposition mask may be retained by a plurality of retainers 80 (in the mode shown in the figure, both sides of the opposite two sides are retained by a plurality of retainers). With this configuration, "twist" can be relieved at the right, left and center places, which enables "twist" over the entirety of the vapor deposition mask to be more effectively suppressed. When one side of the opposite two sides of the vapor deposition mask is retained by a plurality of retainers 80, all of the retainers retaining the one side preferably include the aforementioned "mechanisms in an embodiment of the present invention". In particular, preferably, each of all of the retainers retaining the one side of the opposite two sides of the vapor deposition mask includes all of the mechanisms of the first rotating mechanism, the second rotating mechanism and the moving mechanism, or each of all of the retainers retaining the one side includes the first rotating mechanism and the moving mechanism. Moreover, as shown in the figure, both sides of the opposite two sides of the vapor deposition mask may be retained by a plurality of retainers.

When one side of the opposite two sides of the vapor deposition mask is retained by a plurality of retainers, (A) as shown in FIG. 18, the driving devices 85 may be individually joined with the plurality of retainers and the driving devices joined with the retainers may be individually driven to stretch the vapor deposition mask, or (B) one driving device may be joined with the plurality of retainers (not-shown) and the one driving device may be driven to stretch the vapor deposition mask.

In the case of the mode of the aforementioned item (A), stretching amounts in stretching the vapor deposition mask can be controlled for the individual retainers, which enables "twist" to be more effectively suppressed. Notably, in the mode shown in FIG. 18, the retainers are controlled separately with the corresponding driving devices and one retainer of the plurality of retainers does not restrict movement of the other retainers. Accordingly, in the case of the mode of the aforementioned item (A), the mechanisms individually included in the plurality of retainers may be the same mechanisms or may be different mechanisms. For example, in the mode shown in FIG. 18, one retainer of the plurality of retainers may include the "moving mechanism" and another retainer may include any one or both of the "first rotating mechanism" and the "second rotating mechanism". Notably, this does not mean that it is an essential condition that the individual retainers include different mechanisms, but in the mode of the aforementioned item (A), all of the retainers retaining one side of the vapor deposition mask may include the same mechanism. For example, all of the retainers may include all the mechanisms of the first rotating mechanism, the second rotating mechanism and the moving mechanism, or each of all the retainers may include the first rotating mechanism and the moving mechanism. Moreover, when the retainer 80 retaining one side of the opposite two sides of the vapor deposition mask is in the mode of the aforementioned item (A), while the retainer 80 retaining the other side of the opposite two sides of the vapor deposition mask may include no "mechanism in an embodiment of the present invention", as shown in FIG. 18, it is preferably in the mode of the aforementioned item (A).

On the other hand, in the case of the mode of the aforementioned item (B), one driving device simultaneously drives the plurality of retainers. Accordingly, when the plurality of retainers individually include different mechanisms, there can arise a concern that one retainer of the plurality of retainers prevents movement of another retainer. With this point taken into consideration, in the case of the mode of the aforementioned item (B), all of the plurality of retainers preferably include the same mechanism. For example, all of the retainers retaining one side of the opposite two sides of the vapor deposition mask preferably include all of the first rotating mechanism, the second rotating mechanism and the moving mechanism or each of all the retainers preferably individually includes the first rotating mechanism and the moving mechanism. Moreover, when the retainer 80 retaining one side of the opposite two sides of the vapor deposition mask is in the mode of the aforementioned item (B), while the retainer 80 retaining the other side of the opposite two sides of the vapor deposition mask is not needed to include the "mechanism in an embodiment of the present invention", the retainer 80 retaining the one side of the opposite two sides of the vapor deposition mask and the retainer 80 retaining the other side thereof preferably include the same mechanisms.

The mode of retaining the opposite two sides of the vapor deposition mask by the retainers 80 is above described, exemplified by the case where the shape of the vapor deposition mask in plan view is rectangular. When the vapor deposition mask whose shape in plan view is other than rectangular is used, the aforementioned description of opposite two sides of the vapor deposition mask is sufficient to be replaced by any two places on the outer circumference of the vapor deposition mask, the description of one side of the opposite two sides to be replaced by one place of any two places, and the description of the other of the opposite two sides to be replaced by the other place of any two places. Such any two places are not specially limited but they are preferably portions in which a straight line passing at a substantial center of the vapor deposition mask in plan view intersects the outer circumference of the vapor deposition mask.

According to the stretching step described above, any one or both of the rotating adjustment and the moving adjustment of the vapor deposition mask are performed with the vapor deposition mask being stretched or after stretched. Hence, occurrence of "twist" in the vapor deposition mask can be suppressed. Specifically, the vapor deposition mask 100 can be stretched in the state where "twist" is suppressed by performing the stretching step using the retainer 80 including the "mechanism in an embodiment of the present invention".

In the case where the retainer 80 described above is in the mode of being passively rotated or moved in accordance with force that the vapor deposition mask 100 receives, the retainer 80 is passively rotated or moved in accordance with the force in the occasion of such moving when the vapor deposition mask 100 retained by the retainer 80 is moved after the stretching step, for example, when the vapor deposition mask 100 retained by the retainer 80 is moved to place the vapor deposition mask 100 on the frame 60, or when the vapor deposition mask 100 retained by the retainer 80 is moved to position the vapor deposition mask 100 relative to the frame 60. Thus, there is a case where the state of the vapor deposition mask 100 in which "twist" is suppressed in the aforementioned stretching step cannot be maintained.

With such a point taken into consideration, the state where the vapor deposition mask has undergone any of the rotating adjustment and the moving adjustment is preferable locked by the retainer 80 to maintain the state of the vapor deposition mask having undergone suppression of "twist" after the stretching step. In other words, in the stretching step, a locking step of locking the vapor deposition mask having undergone any one or both adjustments of the rotating adjustment and the moving adjustment such that the state after the adjustment is maintained is preferably further included. In the method for producing a frame-equipped vapor deposition mask by way of example, after the locking step, the locked vapor deposition mask 100 is fixed to the frame in which a through hole is formed. By locking the retainer 80, even when the vapor deposition mask 100 retained by the retainer 80 undergoes movement or the like after the end of the stretching step, the state where "twist" is suppressed can be continuously maintained, which can prevent variation of the vapor deposition mask 100 in which "twist" is suppressed from arising. A locking mechanism is not specially limited but it is sufficient to be a mechanism that can perform stretching outward thereof and can maintain the state of the vapor deposition mask having undergone the "rotating adjustment" or the "moving adjustment". In other words, it is sufficient to be a mechanism with which the vapor deposition mask 100 does not rotate or move after the stretching step. The locking mechanism may be an external mechanism not included in the retainer 80 itself or may be an internal mechanism included in the retainer 80 itself.

As the external mechanism, a mechanism that can exert stress on the retainer 80, for example, a mechanism that externally exerts stress on the retainer 80 and suppresses the vapor deposition mask from rotating or moving after the stretching step can be cited. To summarize, it is a mechanism that invalidates the first rotating mechanism, the second rotating mechanism or the moving mechanism included in the retainer 80 by externally exerting stress. As such a mechanism, for example, an air cylinder, a motor and the like can be cited. By exerting stress in the vertical direction on the retainer 80 using the air cylinder, the motor or the like, the first rotating mechanism, the second rotating mechanism or the moving mechanism in the retainer 80 can be invalidated, namely, the vapor deposition mask can be suppressed from rotating or moving after the stretching step.

As the internal mechanism, the retainer 80 that can control the movement amount and the rotational angle of the vapor deposition mask 100 with the control device such as a motor shown above by way of example can be cited. In other words, the retainer 80 that can actively control the movement amount and the rotational angle of the vapor deposition mask 100 can be cited. According to such a retainer 80, the vapor deposition mask can be mechanically controlled from rotating or moving after the stretching step.

The vapor deposition mask 100 is fixed to the frame 60 in the state where the vapor deposition mask 100 is in contact with the frame 60, in other words, in the state where the vapor deposition mask 100 is placed on the frame 60. Hence, as mentioned later, when the frame 60 in which a reinforcement frame 65 is provided (refer to FIG. 21) is used as the frame 60 to which the vapor deposition mask 100 is fixed, the vapor deposition mask 100 is in contact with the reinforcement frame 60. In the case where the vapor deposition mask 100 comes into contact with the reinforcement frame 65 when the vapor deposition mask 100 in which "twist" is suppressed in the stretching step is placed on the frame 60, there can be a case where the vapor deposition mask 100 suffers distortion at the place of the contact and variation in dimension of the openings 25 provided in the resin mask 20 of the vapor deposition mask 100 arises. Moreover, also in the case where a positioning step mentioned later is performed in the state where the vapor deposition mask 100 is placed on the frame 60, there can be a case where the vapor deposition mask 100 suffers distortion in the stage of positioning. Moreover, in the case where the aforementioned stretching step is performed in the state where the vapor deposition mask 100 is placed on the frame 60, although "twist" of the vapor deposition mask can be suppressed, there can be a case where the vapor deposition mask 100 suffers distortion at the place of the contact of the vapor deposition mask 100 with the frame 60.

Therefore, the method for producing a frame-equipped vapor deposition mask in a preferable mode further includes a first placing step of placing the vapor deposition mask 100 on the frame 60, a separating step of separating the vapor deposition mask 100 from the frame 60 after the first placing step, and a second placing step of placing the vapor deposition mask 100 again on the frame 60 after the separating step, wherein the fixing step is performed after the second placing step, to relieve distortion of the vapor deposition mask 100 arising due to contact of the vapor deposition mask 100 with the frame 60. According to the method for producing a frame-equipped vapor deposition mask of an embodiment further including the first placing step, the separating step and the second placing step, distortion which can arise in the vapor deposition mask in the first-time placing step of placing the vapor deposition mask 100 on the frame 60 is relieved in the separating step, the vapor deposition mask 100 from which the distortion is relieved is placed again on the frame 60 (second placing step), and thereby, the vapor deposition mask from which the distortion is relieved can be fixed onto the frame 60 in the fixing step mentioned later. To summarize, the method for producing a frame-equipped vapor deposition mask in a preferable mode is in that distortion which can arise in the vapor deposition mask 100 due to contact of the vapor deposition mask 100 with the frame 60 in the first placing step is relieved in the separating step. Notably, while the stretching step described above may be performed in any stage before the first placing step, between the first placing step and the separating step, between the separating step and the second placing step, or after the second placing step, it is preferably performed before the separating step in which distortion which can arise in the vapor deposition mask is relieved. In other words, the aforementioned stretching step is preferably performed before the first placing step or between the first placing step and the separating step. This is because if the stretching step is performed after the separating step, the state of the vapor deposition mask from which distortion is relieved tends to suffer variation.

The method for producing a frame-equipped vapor deposition mask including the aforementioned first placing step, separating step and second placing step is particularly preferable when the openings 25 formed in the resin mask 20 of the vapor deposition mask 100 are positioned to a position corresponding to a pattern to be produced by vapor deposition in the state where the vapor deposition mask 100 is placed on the frame 60 in the first placing step. In other words, it is preferable when the positioning is performed between the steps of the first placing step and the separating step. This is because the vapor deposition mask 100 tends to suffer distortion when positioning is performed in the state where the vapor deposition mask 100 is placed on the frame 60. Hereafter, a positioning step of positioning the openings 25 formed in the resin mask 20 of the vapor deposition mask 100 to a position corresponding to a pattern to be produced by vapor deposition is described.

Positioning Step

The positioning step is an arbitrary step in the method for producing a frame-equipped vapor deposition mask of an embodiment of the present invention, and a step of positioning the openings 25 formed in the resin mask 20 of the vapor deposition mask 100 to a position corresponding to a pattern to be produced by vapor deposition. In other words, it is a step of determining position coordinates of the vapor deposition mask 100 with respect to the frame 60 such that the openings 25 formed in the resin mask 20 of the vapor deposition mask 100 match a position corresponding to a pattern to be produced by vapor deposition. By performing the positioning step, a frame-equipped vapor deposition mask with which a vapor deposition pattern can be produced on a vapor deposition target with excellent position precision can be obtained.

A method of positioning the openings 25 formed in the resin mask 20 of the vapor deposition mask 100 to a position corresponding to a pattern to be produced by vapor deposition is not specially limited but a conventionally known positioning method or the like can be properly selected and used. For example, a method in which a reference sheet for positioning the openings 25 formed in the resin mask 20 to a position corresponding to a pattern to be produced by vapor deposition is implemented in the frame 60 to determine position coordinates of the vapor deposition mask using the reference sheet, an alignment mark provided in the vapor deposition mask and the like can be cited. In place of implementing the reference sheet in the frame 60, the reference sheet may be positioned above the vapor deposition mask placed on the frame so as not to be in contact with the vapor deposition mask. Moreover, not using the reference sheet, coordinates or the like of the openings 25 formed in the resin mask 20 of the vapor deposition mask 100 can also be used to determine the position coordinates of the vapor deposition mask. As to a moving method of the vapor deposition mask 100, the frame 60 and the like for determining the position coordinates of the vapor deposition mask, a conventionally known moving device (driving device) can be properly selected and used. For example, a drive stage that moves the retainer 80 retaining the vapor deposition mask and the frame 60 in an in-plane direction can be provided to adjust the position coordinates of the vapor deposition mask with a motor (electrically) or a micrometer (manually).

While in the present embodiment, the vapor deposition mask 100 is placed again on the frame 60 in the second placing step, which results in contact of the vapor deposition mask 100 with the frame 60, distortion arising in the vapor deposition mask 100 in the first placing step is relieved in the separating step. Thereby, as compared with the case where the frame-equipped vapor deposition mask is produced in a producing method not including the separating step and the second placing step, the frame-equipped vapor deposition mask in which dimension variation of the openings 25 in the resin mask 20 of the vapor deposition mask 100 is suppressed can be produced. Moreover, when distortion still arises in the vapor deposition mask after the second placing step, the separating step and the second placing step only have to be repeated.

A method of separating the vapor deposition mask 100 from the frame 60 is not specially limited but, for example, the vapor deposition mask 100 can be separated from the frame 60 by giving a moving mechanism, for example, a vertical moving mechanism to the retainer 80 retaining the vapor deposition mask 100 and driving the retainer 80 in the direction intersecting, for example, the direction substantially perpendicular to the surface of the vapor deposition mask. Moreover, the vapor deposition mask 100 can also be separated from the frame 60 by giving a moving mechanism, for example, a vertical moving mechanism to a drive stage (not-shown) driving the frame 60 and driving the drive stage in the direction intersecting, for example, the direction substantially perpendicular to the surface of the vapor deposition mask. Notably, when the retainer 80 is driven, the pair of retainers 80 retaining the vapor deposition mask 100 are needed to be simultaneously driven, and moreover, there is a possibility that this driving causes distortion and "twist" to arise in the vapor deposition mask 100. Hence, the drive stage that does not cause distortion and "twist" to arise in the vapor deposition mask 100 is preferably used to separate the vapor deposition mask 100 from the frame 60.

While the positioning step is performed between the steps of the first placing step and the separating step is mainly exemplarily described above, the positioning step may be performed before the first placing step, between the separating step and the second placing step or after the second placing step. Notably, when the positioning step is performed after the separating step, variation tends to arise in the state of the vapor deposition mask from which distortion is relieved in the separating step. With this point taken into consideration, the positioning step is preferably performed before the separating step, in other words, before the first placing step or between the first placing step and the separating step. Moreover, when the positioning step is not specially needed, distortion which can arise in the vapor deposition mask in the first placing step can also be relieved in the aforementioned separating step and second placing step, not performing the positioning step. The same holds true for a precise adjusting step mentioned later.

While in the aforementioned preferable mode, distortion which can arise in the vapor deposition mask 100 in the first placing step is relieved in the separating step, dimension variation and shape variation of the openings 25 provided in the resin mask 20 of the vapor deposition mask 100 due to the distortion may be modified using a physical device. The dimension variation mentioned here is a concept including position coordinate variation of openings and dimension variation of the openings.

Figure 24:
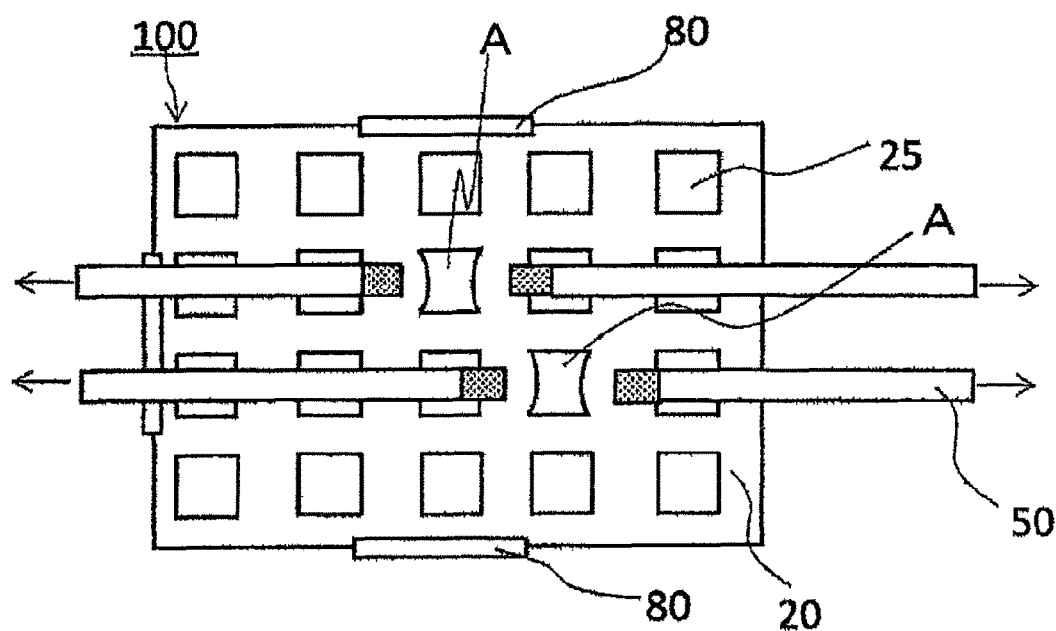
FIG. 24 are diagrams for explaining a precise adjusting step and portions (a) and (b) are elevation views of the vapor deposition mask as seen from the resin mask side.
Figure 24:
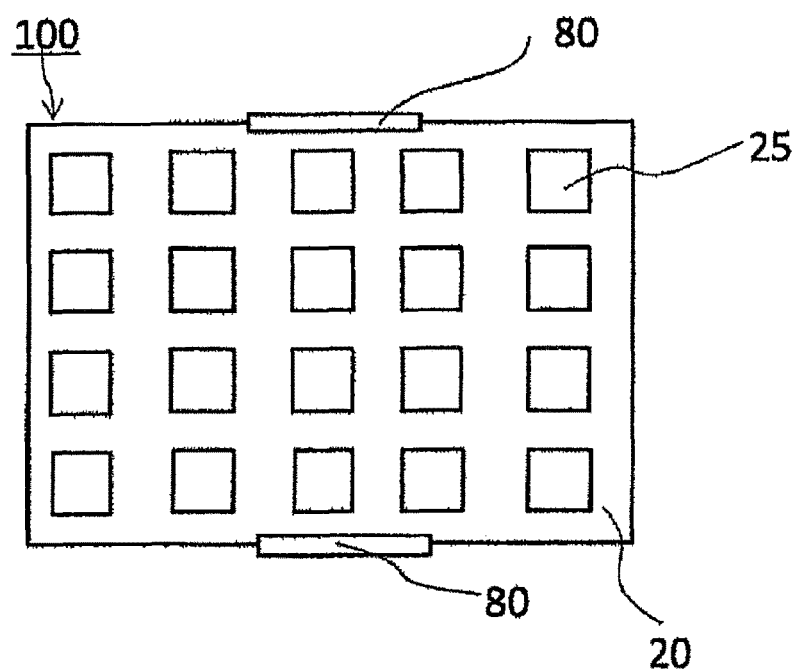

The method for producing a frame-equipped vapor deposition mask in another preferable mode further includes, as shown in FIG. 24, a precise adjusting step of performing precise adjustment on the vapor deposition mask by placing the vapor deposition mask 100 in the state of being stretched on the frame 60 after the stretching step, stacking an auxiliary member 50 on one surface of the vapor deposition mask 100 which is placed on the frame 60 and is in the state of being stretched, fixing the auxiliary member 50 to the vapor deposition mask 100 in at least part of a portion in which the one surface of the vapor deposition mask 100 overlaps with the auxiliary member 50, and pulling the auxiliary member, wherein the fixing step is performed after the precise adjusting step. According to the method for producing a frame-equipped vapor deposition mask in another preferable mode, a physical device using the auxiliary member 50 can modify dimension variation and shape variation of the openings 25, which enables the vapor deposition mask 100 including the resin mask 20 in which the openings 25 are provided to be fixed to the frame 60 in the state where dimensional precision of the openings 25 is maintained to be high.

FIGS. 24(a) and 24(b) are views of the vapor deposition mask 100 as seen from the resin mask 20 side and the illustration of the frame 60 is omitted therein. FIG. 24(a) shows a state where variation arises in shape or dimension of the openings 25 due to contact of the vapor deposition mask 100 with the frame 60 at places designated by signs A and the like.

Moreover, in FIG. 24(a), the auxiliary members 50 are fixed to the vapor deposition mask 100 in at least parts of portions in which the surface of the vapor deposition mask 100 on the resin mask 20 side overlaps with the auxiliary members 50. Further, by pulling the auxiliary members 50 in the direction of the arrows, as shown in FIG. 24(b), the vapor deposition mask 100 in which dimension variation or shape variation of the openings 25 in the resin mask 20 is suppressed can be achieved.

The present embodiment is different from the aforementioned method for producing a frame-equipped vapor deposition mask including the first placing step, the separating step and the second placing step in that variation in dimension and shape of the openings 25 arising due to distortion is relieved by a precise adjustment using a physical device, for example, the aforementioned auxiliary member 50, not relieving distortion in the separating step. In any of the modes, the vapor deposition mask 100 including the resin mask 20 in which the openings 25 are provided can be fixed to the frame 60 in the state where dimensional precision of the openings 25 is maintained to be high, in the fixing step mentioned later.

Moreover, also in the present embodiment, the positioning step described above can be performed before or after the precise adjusting step. Notably, in view of being able to relieve distortion which can arise in the vapor deposition mask in the positioning step by the precise adjusting step, the positioning step is preferably performed before the precise adjusting step. Moreover, the first placing step/separating step/second placing step described above and the precise adjusting step can also be combined and used. By combining these steps, distortion which can arise due to the vapor deposition mask 100 coming into contact with the frame 60 can be more effectively relieved. Notably, the precise adjusting step may be performed before the first placing step, after the second placing step or between any steps of the first placing step to the second placing step. Notably, in view of being able to relieving position coordinate variation of the openings and dimension variation of the openings in the precise adjusting step, the precise adjusting step is preferably performed immediately before the fixing step.

As shown in FIGS. 25(a) to 25(c), the retainer 80 in a preferable mode includes a projection part 82 on its surface. Specifically, the retainer 80 in a preferable mode is composed of a body part 81 and the projection part 82. When a part of the vapor deposition mask 100 is retained by the retainer 80, a tip portion of the projection part 82 comes into contact with the vapor deposition mask 100. According to the retainer 80 in a preferable mode, a contact area of the vapor deposition mask 100 with the retainer 80 can be made small, which enables occurrence of wrinkles and the like which can arise in the vapor deposition mask in retaining the vapor deposition mask 100 by the retainer 80 to be suppressed. FIGS. 25(a) to 25(c) are partial schematic cross-sectional views showing states where the vapor deposition mask 100 is retained by the retainer 80.

Figure 25:
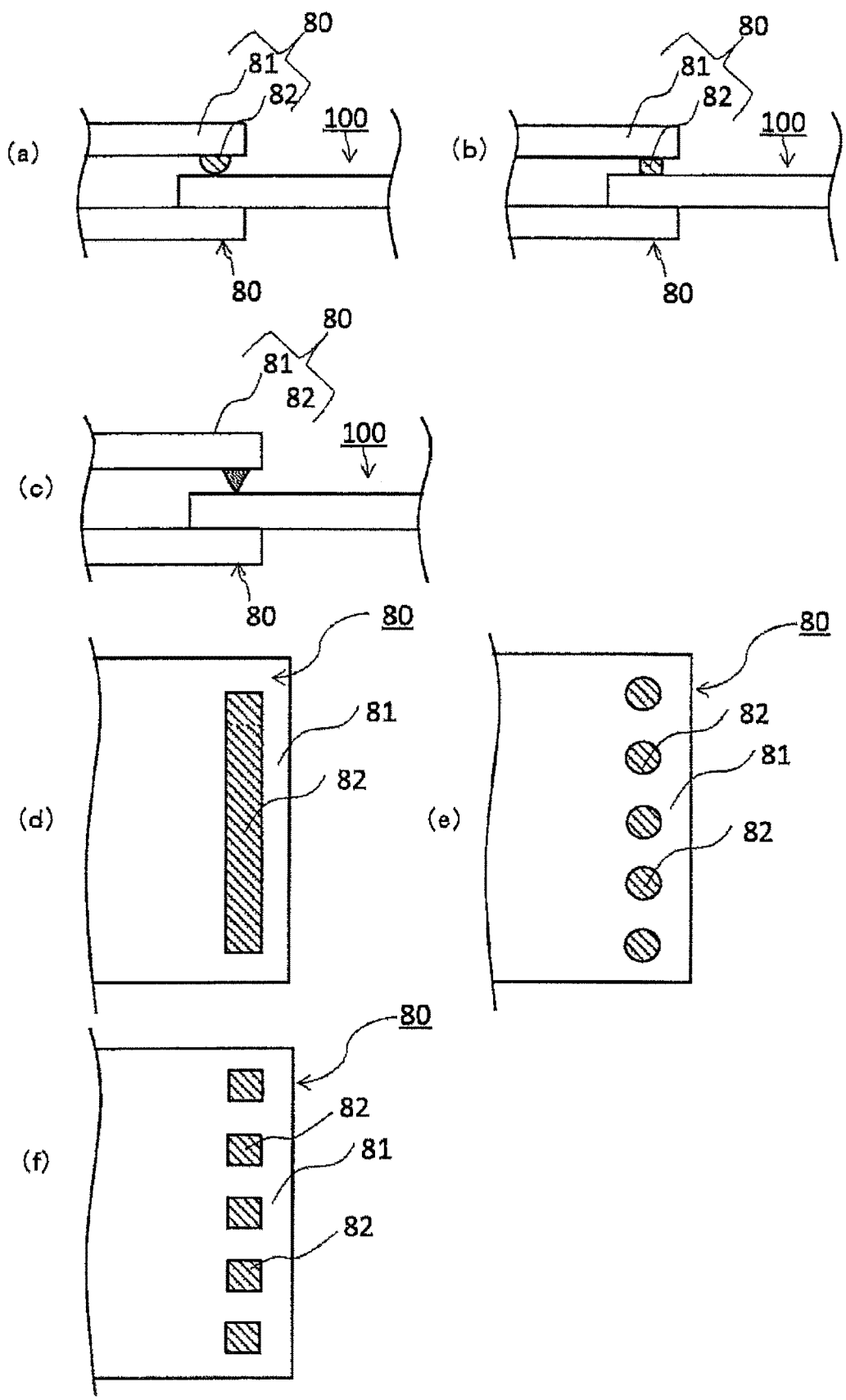
FIG. 25 Portions (a) to (c) are partial schematic cross-sectional views showing a state where a vapor deposition mask 100 is retained by a retainer 80 and portions (d) to (f) are views showing the retainer 80 having a projection part in plan view from the projection part 82 side.

A shape of the tip portion of the projection part 82 is not specially limited but, as shown in FIG. 25(*a*), the shape of the tip portion is preferably an R shape, in other words, a shape in which the shape of the tip portion has curvature. A direction of the curvature is not limited but the R shape of the tip portion may have curvature in the longitudinal direction of the retainer or may have it in the short-side direction thereof. Otherwise, it may have curvature like a semicircle. According to the projection part 82 whose tip portion is the R shape, while the contact area of the vapor deposition mask 100 with the retainer 80 can be made further smaller, a damage which the resin mask 20 of the vapor deposition mask 100 suffers can be suppressed by the projection part 82. As shown in FIG. 25(*d*), the projection part 82 may be arranged to extend in the longitudinal direction or the short-side direction of the retainer 80. As shown in FIGS. 25(*e*) and 25(*f*), a plurality of those may be arranged at predetermined intervals in the longitudinal direction or the short-side direction of the body part 81 of the retainer 80. FIGS. 25(*d*) to 25(*f*) are views exemplarily showing the retainer 80 including the projection part on its surface in plan view from the projection part 82 side.

The material of the projection part 82 is not specially limited but a conventionally known metal material, resin material or the like can be properly selected and used. By making the contact area of the vapor deposition mask 100 with the retainer 80 small with the projection part 82, retaining force of the vapor deposition mask 100 by the retainer 80 tends to deteriorate. With this point taken into consideration, the projection part 82 is preferably composed of material high in retaining force, in other words, material high in gripping ability. As the material high in gripping ability, the materials exemplarily presented for the aforementioned resin mask, conventionally known resins other than these and the like can be cited. Above all, the projection part 82 composed of high elasticity material, for example, elastic rubber is preferable in view of being able to more enhance gripping ability of the retainer 80 with the vapor deposition mask 100. Notably, since the body part 81 does not come into direct contact with the vapor deposition mask 100, there may be any material such as metal material, resin material and materials other than these.

While in the mode shown in the figure only the retainer 80 on the side of being in contact with one surface of the vapor deposition mask 100 (in the mode shown in the figure, the upper surface) includes the projection part 82 and the retainer 80 on the side of being in contact with the other surface of the vapor deposition mask 100 (in the mode shown in the figure, the lower surface) does not include the projection part 82, also the retainer 80 on the side of being in contact with the other surface of the vapor deposition mask 100 may include the projection part 82. Moreover, only the retainer 80 on the side of being in contact with the other surface of the vapor deposition mask 100 may include the projection part 82.

Fixing Step

Figure 19:
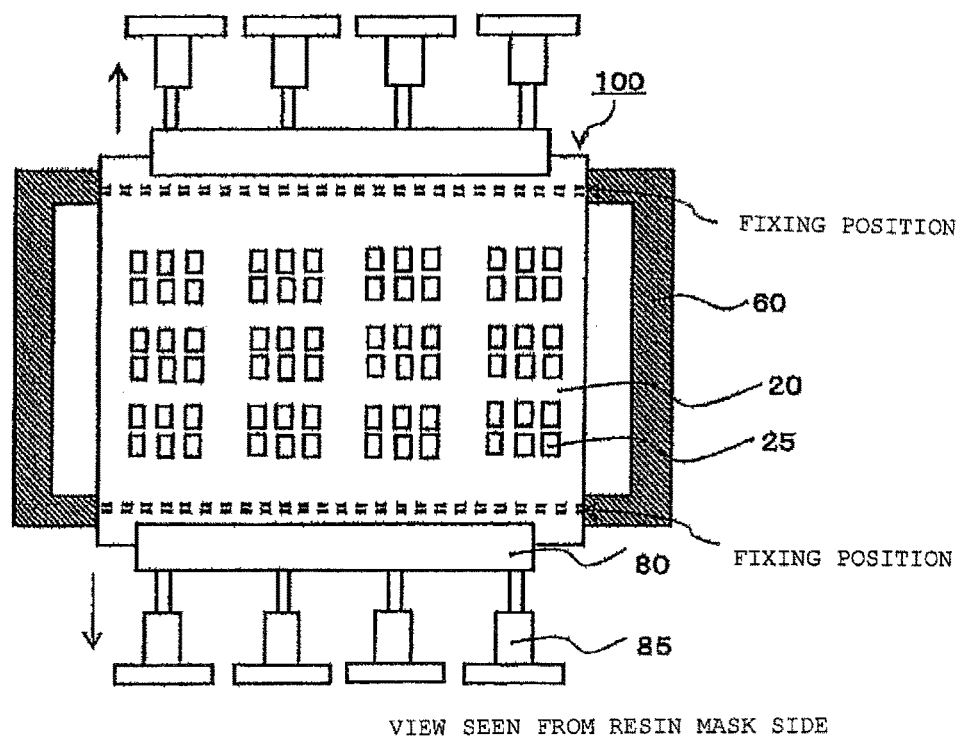
FIG. 19 is a top view for explaining a fixing step.
Figure 20:
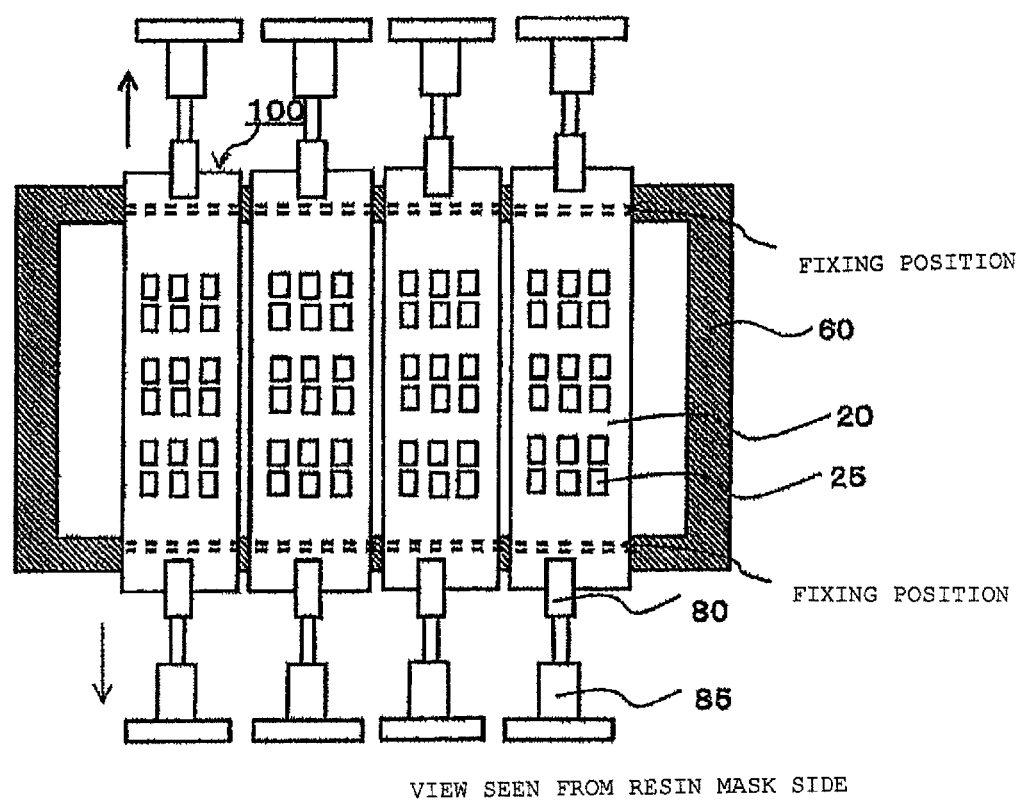
FIG. 20 is a top view for explaining the fixing step.

As shown in FIG. 19 and FIG. 20, the fixing step is a step of performing overlapping on the frame 60 in which a through hole is formed such that the frame portion of the frame 60 opposes the metal mask 10 of the vapor deposition mask in the state of being stretched in the stretching step, and fixing the vapor deposition mask 100 in the state of being stretched in the stretching step to the frame 60. Fixing of the vapor deposition mask 100 to the frame 60 is performed at a position where the metal portion of the vapor deposition mask is in contact with the frame 60, and the position is not specially limited (refer to the "fixing positions" in FIG. 19 and FIG. 20). FIG. 19 is a top view of the frame-equipped vapor deposition mask in which one vapor deposition mask is fixed to the frame 60 as seen from the resin mask side. FIG. 20 is a top view of the frame-equipped vapor deposition mask 200 in which a plurality of vapor deposition masks 100 are fixed to the frame 60 as seen from the resin mask side. Notably, in the modes shown in the figures, the end parts of the vapor deposition masks 100 protrude outward from the end parts of the frames and the protruding parts are retained by the retainers 80.

Frame

The frame 60 is a substantially rectangular frame member and includes a through hole for exposing the openings 25 provided in the resin mask 20 of the vapor deposition mask 100 fixed in the final stage to the vapor deposition source side. The material of the frame is not specially limited but metal material large in rigidity such, for example, as SUS and invar material is preferable. Ceramic material and the like can be used. Above all, a metal frame is preferable in view of being able to easily performing fixing of the metal mask of the vapor deposition mask thereto by welding or the like and being small in influence of deformation and the like.

The thickness of the frame 60 is not specially limited but it is preferably about 10 mm to about 30 mm in view of rigidity and the like. The width between the inner circumference end face of the opening of the frame and the outer circumference end face of the frame is not specially limited in the case of the width with which the metal mask of the vapor deposition mask can be fixed to the frame but, for example, it is exemplarily a width of about 10 mm to about 70 mm.

Figure 21:
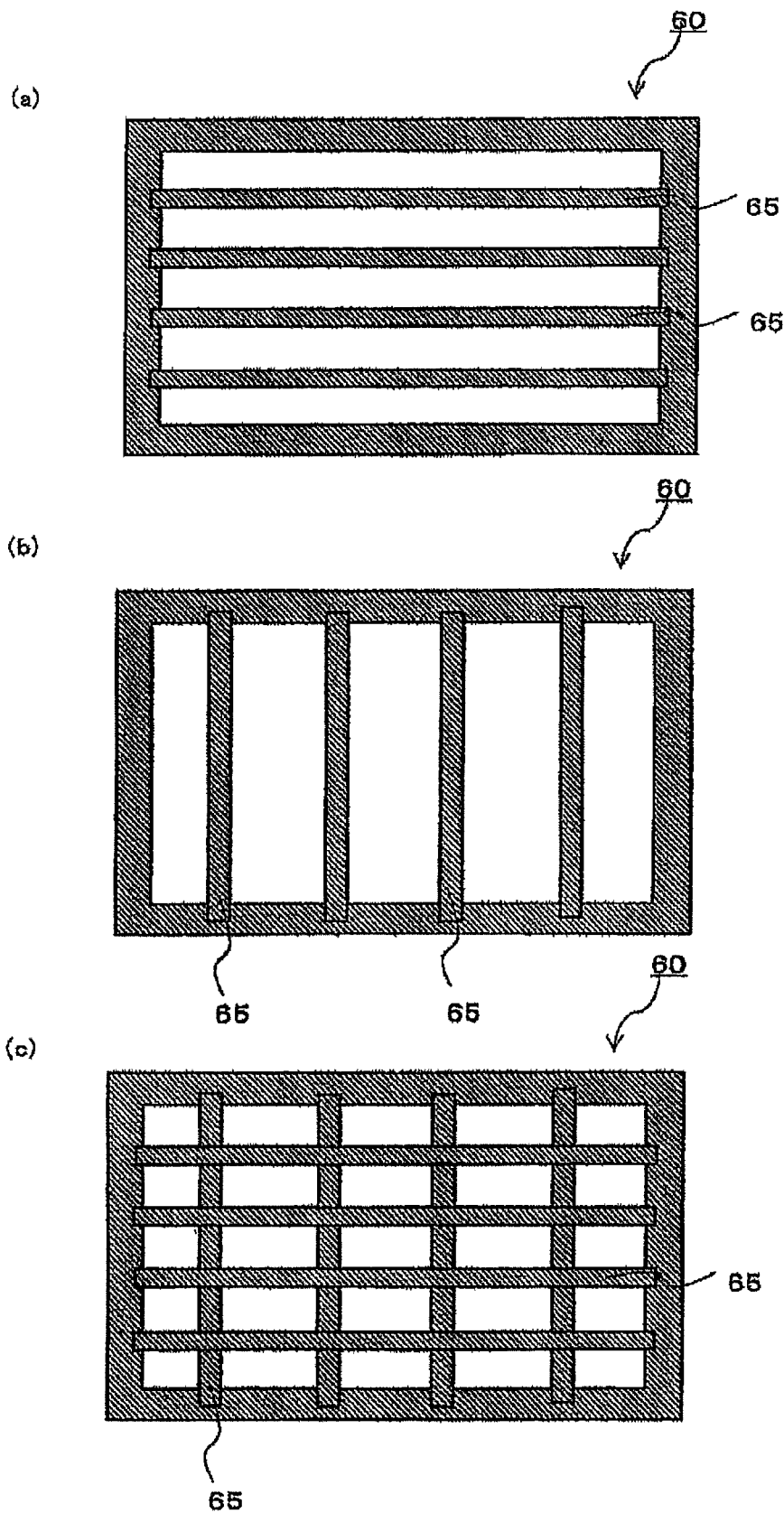
FIG. 21 portions (a) to (c) are top views exemplarily showing a frame.

Moreover, as shown in FIGS. 21(*a*) to 21(*c*), the frame 60 in which a reinforcement frame 65 or the like is provided in a region of the through hole may be used within a range where the openings 25 of the resin mask 20 composing the vapor deposition mask 100 are not prevented from being exposed. To provide the reinforcement frame 65 enables the vapor deposition mask 100 to be fixed to the frame 60 using the reinforcement frame 65.

Figure 22:
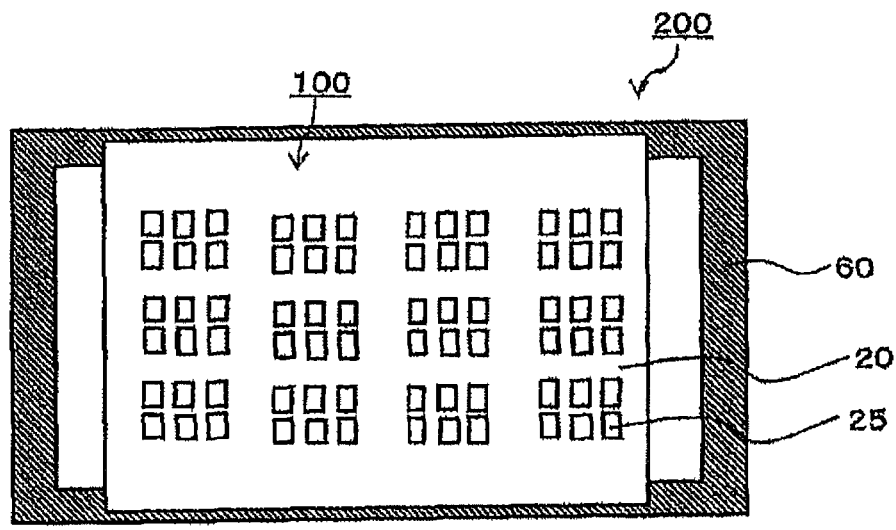
FIG. 22 is a top view exemplarily showing a frame-equipped vapor deposition mask.
Figure 23:
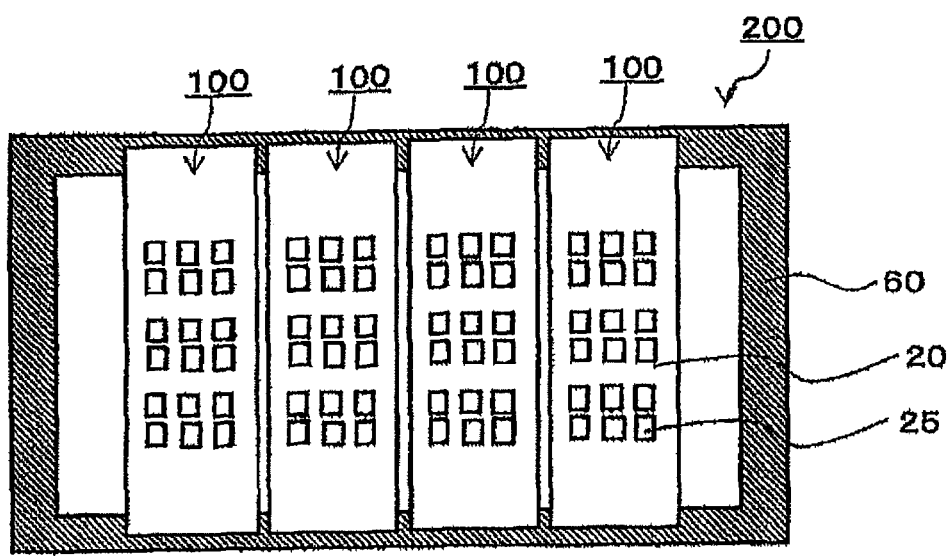
FIG. 23 is a top view exemplarily showing the frame-equipped vapor deposition mask.

The fixing method is not specially limited but the vapor deposition mask 100 can be fixed to the frame 60 using various conventionally known welding methods such as laser welding, arc welding, electric resistance welding and an electron beam welding method, an adhesive agent, screw fastening and the like. After the vapor deposition mask is fixed to the frame, by cutting portions of the vapor deposition mask that protrude from the frame, as shown in FIG. 22 and FIG. 23, the frame-equipped vapor deposition mask 200 having the vapor deposition mask fixed to the frame is obtained. FIG. 22 is a top view exemplarily showing the frame-equipped vapor deposition mask 200 obtained by cutting the protruding portions after the vapor deposition mask 100 shown in FIG. 19 is fixed to the frame 60 and a view as seen from the resin mask side. FIG. 23 is a top view exemplarily showing the frame-equipped vapor deposition mask 200 obtained by cutting the protruding portions after the vapor deposition masks 100 shown in FIG. 20 are fixed to the frame 60 and a view as seen from the resin mask side.

In the aforementioned method for producing a frame-equipped vapor deposition mask of an embodiment, the vapor deposition mask is fixed to the frame 60 in the state where the vapor deposition mask is being stretched, in other words, in the state where tensile force is exerted on the vapor deposition mask. Here, focusing on the vapor deposition mask 100 after the fixing step is ended, counterforce corresponding to the tensile force arises on the vapor deposition mask 100 in the reverse direction to the direction in which the vapor deposition mask is stretched in the stretching step, and when this counterforce is large, there can be a case where this causes a problem that distortion arises in the vapor deposition mask fixed to the frame or a similar problem.

Therefore, in the method for producing a frame-equipped vapor deposition mask in a preferable mode, with counterforce which can arise in the vapor deposition mask 100 after fixing taken into consideration, the vapor deposition mask is fixed to the frame 60. Specifically, the vapor deposition mask 100 is fixed to the frame 60 such that the counterforce which can arise in the vapor deposition mask 100 after fixing is cancelled. More specifically, with the counterforce which can arise in the vapor deposition mask 100 after the fixing step taken into consideration, the vapor deposition mask is fixed to the frame in the state where compressive stress corresponding to the counterforce is exerted on the frame 60. According to this mode, by relieving the compressive stress exerted on the frame after the fixing step, the counterforce which can arise in the vapor deposition mask 100 can be cancelled, which enables distortion and the like due to the counterforce which can arise in the vapor deposition mask to be suppressed from arising in the vapor deposition mask fixed to the frame. Notably, the counterforce which can arise in the vapor deposition mask 100 after fixing is force corresponding to the tensile force exerted on the vapor deposition mask 100 in the stretching step.

In other words, the method for producing a frame-equipped vapor deposition mask in a preferable mode further includes a step of exerting compressive stress on the frame 60 in the fixing step and a step of relieving the compressive stress after the fixing step.

The compressive stress exerted on the frame 60 may be performed with the counterforce which can arise in the vapor deposition mask, namely the tensile force exerted on the vapor deposition mask in the stretching step taken into consideration. For example, when the frame-equipped vapor deposition mask having one vapor deposition mask 100 fixed to the frame is produced, the vapor deposition mask 100 is sufficient to be fixed to the frame 60 in the state where compressive stress corresponding to tensile force exerted on the one vapor deposition mask is exerted on the frame 60. Specifically, assuming that the tensile force exerted on the vapor deposition mask in the stretching step is "1", the vapor deposition mask 100 is sufficient to be fixed to the frame 60 in the state where compressive stress of "1" is exerted on the frame 60. According to this method, the counterforce arising in the vapor deposition mask can be cancelled by relieving the compressive stress exerted on the frame after the fixing step, which enables distortion or the like due to the counterforce to be suppressed from arising in the vapor deposition mask fixed to the frame 60.

Next, the case where a plurality of vapor deposition masks are fixed to the frame 60 is described. When a plurality of vapor deposition masks 100 are fixed to the frame 60, compressive stress is exerted on the frame 60 with counterforce which can arise in each vapor deposition mask 100 taken into consideration, and the vapor deposition masks 100 are sequentially fixed to the frame 60 while the compressive stress is being changed in stages. Specifically, counterforce of the vapor deposition masks that have been already fixed to the frame is subtracted from the total counterforce of the plurality of vapor deposition masks, fixing is performed in the state where the compressive stress corresponding to the counterforce after the subtraction is exerted on the frame.

For example, in the case where three vapor deposition masks are sequentially fixed to the frame 60, assuming that tensile force exerted on each vapor deposition mask and counterforce arising in each vapor deposition mask are "1", the total counterforce of the vapor deposition masks is "3".

In the stage where the vapor deposition masks are not fixed to the frame, in other words, when a first vapor deposition mask is to be fixed to the frame, fixing is performed in the state where compressive stress of "3" which is the counterforce of the whole vapor deposition masks is exerted on the frame 60. Next, when fixing a second vapor deposition mask, fixing is performed in the state where compressive stress obtained by subtracting the counterforce of one vapor deposition mask 100 that have been already fixed to the frame 60 from "3" which is the counterforce of the whole vapor deposition masks, in other words, compressive stress of "2" is exerted on the frame 60. When fixing a third vapor deposition mask, fixing is performed in the state where compressive stress obtained by subtracting the total counterforce of two vapor deposition masks that have been already fixed to the frame 60 from "3" which is the counterforce of the whole vapor deposition masks, in other words, compressive stress of "1" is exerted on the frame 60. Then, after to fix all of the vapor deposition masks to the frame is ended, the compressive stress is relieved.

According to this method, all of the counterforce arising in each of the plurality of vapor deposition masks can be cancelled by relieving the compressive stress exerted on the frame, after the fixing step, which enables distortion or the like due to the counterforce to be suppressed from arising in all of the vapor deposition masks.

The method of exerting compressive stress on the frame 60 is not specially limited but, for example, an air cylinder, a motor or the like can be used. The compressive stress is sufficient to be exerted in the reverse direction to the direction in which the vapor deposition mask is stretched in the stretching step, in other words, in the same direction as the direction in which the counterforce arises.

As above, the method for producing a frame-equipped vapor deposition mask of an embodiment of the present invention has been described. The method for producing a frame-equipped vapor deposition mask of an embodiment of the present invention is not limited to the aforementioned embodiments but proper modifications can occur without departing from the spirit of an embodiment of the present invention. For example, while in the above, as the mode of retaining a part of the vapor deposition mask 100, the mode of retaining opposite two sides of the vapor deposition mask 100 by the retainers 80 is mainly described, all of the sides of the vapor deposition mask 100 can also be retained by the retainers 80. In this case, at least one retainer of the retainers 80 which retain the vapor deposition mask 100 is sufficient to include any mechanisms of the aforementioned first rotating mechanism, second rotating mechanism and moving mechanism. Two or more retainers or all of the retainers 80 may include any mechanisms of the aforementioned first rotating mechanism, second rotating mechanism and moving mechanism.

Stretching Apparatus

Next, a stretching apparatus of an embodiment of the present invention is described. The stretching apparatus of an embodiment of the present invention is a stretching apparatus for stretching a vapor deposition mask and includes: a retainer that retains a part of the vapor deposition mask; and a stretching mechanism for stretching the vapor deposition mask retained by the retainer, wherein the retainer includes at least one mechanism of a first rotating mechanism rotatable with a first rotational axis intersecting a surface of the vapor deposition mask being as an axis, a second rotating mechanism rotatable with a second rotational axis not intersecting the surface of the vapor deposition mask being as an axis, and a linearly movable moving mechanism.

The stretching apparatus by way of example includes the retainer for retaining a part of the vapor deposition mask, wherein the retainer includes at least one mechanism of the first rotating mechanism rotatable with the first rotational axis perpendicular to the surface of the vapor deposition mask being as an axis, the second rotating mechanism rotatable with the second rotational axis parallel to the surface of the vapor deposition mask being as an axis, and the moving mechanism movable in the direction perpendicular to the direction in which the vapor deposition mask is stretched.

The retainer composing the stretching apparatus can properly select and employ the various modes of the retainers 80 described for the aforementioned method for producing a frame-equipped vapor deposition mask, and its detailed description is omitted here. Moreover, the vapor deposition mask stretched by the stretching apparatus can also properly select and employ the various modes of the vapor deposition masks 100 described for the aforementioned method for producing a frame-equipped vapor deposition mask, and its detailed description is omitted here.

According to the stretching apparatus of an embodiment of the present invention, occurrence of "twist" which can arise due to stretching the vapor deposition mask can be suppressed.

Moreover, in the stretching apparatus in a preferable mode, the retainer composing the stretching apparatus includes the locking mechanism. According to the stretching apparatus in a preferable mode, occurrence of "twist" can be further suppressed. The locking mechanism is as described for the aforementioned method for producing a frame-equipped vapor deposition mask and its detailed description is omitted here.

Moreover, the stretching apparatus in a preferable mode includes the drive stage for driving the frame. The drive stage includes the moving mechanism movable in the direction intersecting the installation plane of the stretching apparatus, in other words, in the direction intersecting the surface of the vapor deposition mask. It still preferably includes the vertical moving mechanism movable in the direction substantially perpendicular to the surface of the vapor deposition mask. Moreover, in the stretching apparatus in another preferable mode, the retainer includes the moving mechanism movable in the direction intersecting the installation plane of the stretching apparatus, in other words, in the direction intersecting the surface of the vapor deposition mask. It still preferably includes the vertical moving mechanism movable in the direction substantially perpendicular to the surface of the vapor deposition mask. The direction intersecting the installation plane of the stretching apparatus is not specially limited but properly configured. Moreover, to be substantially perpendicular stated here means the direction of about 85° to about 95° with respect to the installation plane of the stretching apparatus, preferably 90°.

Apparatus for Producing Organic Semiconductor Device

Next, an apparatus for producing an organic semiconductor device of an embodiment of the present invention (hereinafter referred to as apparatus for producing an organic semiconductor device of an embodiment) is described. The apparatus for producing an organic semiconductor device of an embodiment is characterized in having the stretching apparatus of an embodiment described above implemented in a conventionally known organic semiconductor apparatus for producing an organic semiconductor device. As to the stretching apparatus implemented in the apparatus for producing an organic semiconductor device of an embodiment, the aforementioned stretching apparatus of an embodiment can be properly selected and used and its detailed description is omitted here.

The apparatus for producing an organic semiconductor device of an embodiment is not limited in any manner other than the stretching apparatus of an embodiment implemented therein but a conventionally known apparatus for producing an organic semiconductor device which apparatus forms a vapor deposition pattern of the organic semiconductor device in a vapor deposition method using a vapor deposition mask is sufficient to be properly selected and have the aforementioned stretching apparatus of an embodiment implemented therein.

According to the apparatus for producing an organic semiconductor device of an embodiment, an organic semiconductor device can be produced using the frame-equipped vapor deposition mask in which the vapor deposition mask in the state where "twist" is suppressed by the stretching apparatus implemented in the relevant producing apparatus is fixed to the frame. Accordingly, an organic semiconductor device with a high definition pattern can be formed to match the dimensions of the openings formed in the vapor deposition mask.

Method for Producing Organic Semiconductor Device

Next, an embodiment of a method for producing an organic semiconductor device of an embodiment of the present invention is described. The method for producing an organic semiconductor device of an embodiment of the present invention includes a step of forming a vapor deposition pattern in a vapor deposition method using a frame-equipped vapor deposition mask, wherein the following frame-equipped vapor deposition mask is used in the step of forming the organic semiconductor device. The vapor deposition method using the frame-equipped vapor deposition mask is not limited in any manner but, for example, examples thereof can include PVD (Physical Vapor Deposition) methods such as a reactive sputtering method, a vacuum vapor deposition method, ion plating and an electron beam vapor deposition method, CVD (Chemical Vapor Deposition) methods such as thermal CVD, plasma CVD and photo-induced CVD, and the like.

The method for producing an organic semiconductor device of an embodiment including the step of forming the vapor deposition pattern in the vapor deposition method using the frame-equipped vapor deposition mask includes an electrode forming step of forming electrodes on a substrate, an organic layer forming step, a counter electrode forming step, a sealing layer forming step and the like. In any of these steps, the vapor deposition pattern is formed on the substrate in the vapor deposition method using the frame-equipped vapor deposition mask. For example, when the vapor deposition method using the frame-equipped vapor deposition mask is applied to the organic layer forming step, the vapor deposition pattern of the organic layer is formed on the substrate. Notably, the method for producing an organic semiconductor device of an embodiment of the present invention is not limited to these steps but can be applied to any conventionally known steps in the organic semiconductor device using the vapor deposition method.

The aforementioned method for producing an organic semiconductor device of an embodiment includes a step of forming a vapor deposition pattern on a vapor deposition target using a frame-equipped vapor deposition mask in which a vapor deposition mask is fixed to a frame, wherein the frame-equipped vapor deposition mask used in the step of forming the vapor deposition pattern is a frame-equipped vapor deposition mask obtained by a stretching step of retaining a part of the vapor deposition mask by a retainer, stretching the vapor deposition mask retained by the retainer outward thereof, and performing any one or both adjustments of a rotating adjustment and a moving adjustment of the vapor deposition mask with respect to the vapor deposition mask in a state of being stretched or with the vapor deposition mask being stretched, and a fixing step of fixing, after the stretching step, the vapor deposition mask in the state of being stretched to the frame in which a through hole is formed.

The method for producing an organic semiconductor device of an embodiment by way of example is characterized in that in a step of forming a vapor deposition pattern, a vapor deposition mask fixed to a frame is a frame-equipped vapor deposition mask produced by the steps of a preparing step of preparing the vapor deposition mask including a metal mask in which a plurality of slits are formed and a resin mask in which openings corresponding to a pattern to be produced by vapor deposition are formed at a position overlapping with the slits, the metal mask and the resin mask being stacked, a stretching step of retaining opposite two sides of the vapor deposition mask prepared in the preparing step by retainers, and stretching the vapor deposition mask by pulling at least one of the retainers outward of the vapor deposition mask, and a fixing step of fixing the vapor deposition mask to the frame in which a through hole is formed in a state where the vapor deposition mask is being stretched, in that at least one of the retainers retaining the vapor deposition mask in the stretching step is a retainer including at least one mechanism of a first rotating mechanism rotatable with a first rotational axis perpendicular to a surface of the vapor deposition mask being as an axis, a second rotating mechanism rotatable with a second rotational axis parallel to the surface of the vapor deposition mask being as an axis, and a moving mechanism movable in a direction perpendicular to a direction in which the vapor deposition mask is stretched, and in that in the stretching step, any one or both adjustments of a rotating adjustment and a moving adjustment of the vapor deposition mask are performed by the retainer with respect to the vapor deposition mask stretched outward thereof or with the vapor deposition mask being stretched outward thereof.

In other words, it is characterized in that the frame-equipped vapor deposition mask used in the method for producing an organic semiconductor device is the frame-equipped vapor deposition mask produced in the method for producing a frame-equipped vapor deposition mask of an embodiment of the present invention described above. According to the frame-equipped vapor deposition mask characterized as above, since the vapor deposition mask is fixed to the frame in the state where "twist" is suppressed, an organic semiconductor device with a high definition pattern can be formed to match the dimensions of the openings formed in the vapor deposition mask. Examples of the organic semiconductor device produced in the producing method of an embodiment of the present invention can include, for example, organic layers, light emitting layers and cathode electrodes of an organic EL element and the like. In particular, the method for producing an organic semiconductor device of an embodiment of the present invention can be preferably used for producing R, G and B light emitting layers of an organic EL element which need high definition pattern precision.

REFERENCE SIGNS LIST

10 Metal mask
15 Slit
20 Resin mask
25 Opening
60 Frame
80 Retainer
81 Body part
82 Projection part
85 Driving device
90 Retainer supporting frame
100 Vapor deposition mask
200 Frame-equipped vapor deposition mask

The invention claimed is:

1. A method for producing a frame-equipped vapor deposition mask, comprising the steps of:
preparing a vapor deposition mask including a resin mask having an opening corresponding to a pattern to be produced by vapor deposition;
retaining a part of the vapor deposition mask by a retainer;
stretching the vapor deposition mask outwardly by the retainer; and
fixing, after the stretching step, the vapor deposition mask to a frame having a through-hole with the vapor deposition mask stretched,
wherein the retainer comprises at least one mechanism of
a first rotating mechanism rotatable about a first rotational axis that intersects a surface of the vapor deposition mask,
a second rotating mechanism rotatable about a second rotational axis that does not intersect the surface of the vapor deposition mask, and
a linearly moving mechanism by which the retainer is movable along an axis of a direction that is different from an axis of a direction in which the vapor deposition mask is stretched, and
wherein during the stretching step, any rotating adjustment or moving adjustment of the vapor deposition mask is performed by at least one of the first rotating mechanism, the second rotating mechanism and the moving mechanism in the retainer while the vapor deposition mask is being stretched or after the vapor deposition mask has been stretched,
said method further comprising:
a locking step of locking the vapor deposition mask having undergone at least one of the rotating adjustment and the moving adjustment in the stretching step so as to maintain a state after the adjustment, wherein
in the fixing step, the locked vapor deposition mask is fixed to the frame having the through-hole.

2. The method for producing a frame-equipped vapor deposition mask according to claim 1, further comprising:
a first placing step of placing the vapor deposition mask on the frame;
a separating step of separating the vapor deposition mask from the frame after the first placing step; and
a second placing step of placing the vapor deposition mask again on the frame after the separating step, wherein the stretching step is performed before the first placing step or between the first placing step and the separating step, and the fixing step is performed after the second placing step.

3. The method for producing a frame-equipped vapor deposition mask according to claim 1, further comprising:

after the stretching step, a precise adjusting step of performing a precise adjustment of the vapor deposition mask by stacking an auxiliary member on one surface of the vapor deposition mask in the state of being stretched, fixing the auxiliary member to the vapor deposition mask in at least part of a portion in which the one surface of the vapor deposition mask and the auxiliary member overlap with each other, and pulling the auxiliary member, wherein the fixing step is performed after the precise adjusting step.

4. A method for producing a frame-equipped vapor deposition mask, comprising the steps of:

preparing a vapor deposition mask including a resin mask having an opening corresponding to a pattern to be produced by vapor deposition;

retaining a part of the vapor deposition mask by a retainer;

stretching the vapor deposition mask outwardly by the retainer;

fixing, after the stretching step, the vapor deposition mask to a frame having a through-hole with the vapor deposition mask stretched;

first placing the vapor deposition mask on the frame;

separating the vapor deposition mask from the frame after first placing the vapor deposition mask; and second placing the vapor deposition mask again on the frame after separating the vapor deposition mask, wherein the stretching step is performed before the first placing step or between the first placing step and the separating step, and the fixing step is performed after the second placing step.

5. A method for producing a frame-equipped vapor deposition mask, comprising the steps of:

preparing a vapor deposition mask including a resin mask having an opening corresponding to a pattern to be produced by vapor deposition;

retaining a part of the vapor deposition mask by a retainer;

stretching the vapor deposition mask outwardly by the retainer;

fixing, after the stretching step, the vapor deposition mask to a frame having a through-hole with the vapor deposition mask stretched; and precise adjusting, after the stretching step, the vapor deposition mask by stacking an auxiliary member on one surface of the vapor deposition mask in the state of being stretched, fixing the auxiliary member to the vapor deposition mask in at least part of a portion in which the one surface of the vapor deposition mask and the auxiliary member overlap with each other, and pulling the auxiliary member, wherein the fixing step is performed after the precise adjusting step.

6. A method for producing an organic semiconductor device, comprising a step of forming a vapor deposition pattern on a vapor deposition target using a frame-equipped vapor deposition mask in which a vapor deposition mask is fixed to a frame, wherein the frame-equipped vapor deposition mask used in the step of forming the vapor deposition pattern is the frame-equipped vapor deposition mask obtained by the method for producing a frame-equipped vapor deposition mask set forth in claim 1.

* * * * *